United States Patent
Olivadese et al.

(10) Patent No.: US 11,889,770 B2
(45) Date of Patent: Jan. 30, 2024

(54) LOW LOSS CONDUCTIVE LINE USING BRIDGED CONDUCTOR

(71) Applicant: International Business Machines Corporation, Armonk, NY (US)

(72) Inventors: Salvatore Bernardo Olivadese, Stamford, CT (US); Sarunya Bangsaruntip, Mount Kisco, NY (US); Daniela Florentina Bogorin, Syracuse, NY (US); Nicholas Torleiv Bronn, Long Island City, NY (US); Sean Hart, Tarrytown, NY (US); Patryk Gumann, Tarrytown, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 250 days.

(21) Appl. No.: 16/850,862

(22) Filed: Apr. 16, 2020

(65) Prior Publication Data
US 2021/0328125 A1 Oct. 21, 2021

(51) Int. Cl.
*H01L 39/02* (2006.01)
*H10N 60/80* (2023.01)
(Continued)

(52) U.S. Cl.
CPC ............ *H10N 60/80* (2023.02); *G06N 10/00* (2019.01); *H01P 3/026* (2013.01); *H10N 60/01* (2023.02);
(Continued)

(58) Field of Classification Search
CPC ......... H01L 39/02; H01L 39/24; G06N 10/00; G06N 10/40; H01P 3/026; H01P 3/003; H01P 11/003; B82Y 10/00
See application file for complete search history.

(56) References Cited

U.S. PATENT DOCUMENTS

| 5,408,742 A | 4/1995 | Zaidel et al. |
| 2007/0229199 A1 | 10/2007 | Cheng et al. |

(Continued)

FOREIGN PATENT DOCUMENTS

| CN | 107482293 | 12/2017 |
| CN | 108226656 | 6/2018 |

(Continued)

OTHER PUBLICATIONS

A. Dunsworth, "Low Loss Multi-Layer Wiring for Superconducting Microwave Devices", Dec. 6, 2017, Department of Physics, University of California, Santa Barbara, California, 93106-9530 and Google Inc., Santa Barbara, CA 93117 USA (Year: 2017).*

(Continued)

*Primary Examiner* — Ermias T Woldegeorgis
(74) *Attorney, Agent, or Firm* — Amin, Turocy & Watson, LLP

(57) ABSTRACT

Techniques for designing and fabricating quantum circuitry, including a coplanar waveguide (CPW), for quantum applications are presented. With regard to a CPW, a central conductor and two return conductor lines can be formed on a dielectric substrate, with one return conductor line on each side of the central conductor and separated from it by a space. The central conductor can have bridge portions that can be raised a desired distance above the substrate and base conductor portions situated between the bridge portions and in contact with the surface of the substrate; and/or portions of the substrate underneath the bridge portions of the central conductor can be removed such that the bridge portions, whether raised or unraised, can be the desired distance above the surface of the remaining substrate, and the base conductor portions can be in contact with other portions of the surface of the substrate that were not removed.

25 Claims, 16 Drawing Sheets

(51) Int. Cl.
  *G06N 10/00* (2022.01)
  *H01P 3/02* (2006.01)
  *H10N 60/01* (2023.01)
  *G06N 10/40* (2022.01)
  *H01P 11/00* (2006.01)
  *H01P 3/00* (2006.01)
  *B82Y 10/00* (2011.01)

(52) U.S. Cl.
  CPC .............. *B82Y 10/00* (2013.01); *G06N 10/40* (2022.01); *H01P 3/003* (2013.01); *H01P 11/003* (2013.01)

(56) References Cited

U.S. PATENT DOCUMENTS

| | | | |
|---|---|---|---|
| 2016/0276337 A1 | 9/2016 | Reed | |
| 2017/0062898 A1* | 3/2017 | Chang | H01P 7/08 |
| 2019/0042964 A1 | 2/2019 | Elsherbini et al. | |
| 2019/0043919 A1 | 2/2019 | George et al. | |
| 2019/0267692 A1 | 8/2019 | Roberts et al. | |
| 2019/0341540 A1* | 11/2019 | Megrant | H01L 39/08 |

FOREIGN PATENT DOCUMENTS

| | | |
|---|---|---|
| JP | 2001-007308 A | 1/2001 |
| JP | 2001007608 | 1/2001 |
| WO | 2018160184 | 9/2019 |

OTHER PUBLICATIONS

International Search Report and Written Opinion for International Application Serial No. PCT/EP2021/056604 dated Jun. 22, 2021, 13 pages.

Dunsworth et al., "A method for building low loss multi-layer wiring for superconducting microwave devices," Appl. Phys. Lett. 112, 063502, Feb. 6, 2018, 5 pages.

Zheng et al., "Ship-bridge collision monitoring system based on flexible quantum tunneling composite with cushioning capability," Smart Materials and Structures, vol. 27, No. 7, Jun. 1, 2018, 21 pages.

Weller et al., "The Effects of Line Width and Slot Etching on Silicon-Based CPW at MM-Wave Frequencies," Physical Review Applied, vol. 12, No. 1, Jul. 2019, 9 pages.

Sandberg et al., "Etch induced microwave losses in titanium nitride superconducting resonators," Applied Physics Letters, vol. 100, No. 26, Jun. 2012, 5 pages.

Woods et al., "Determining interface dielectric losses in superconducting coplanar waveguide resonators," Physical Review Applied, vol. 12, No. 1, Jul. 2019, 8 pages.

Office Action received for Chinese Patent Application Serial No. 202180025216.1 dated Oct. 28, 2023, 7 pages (Original Copy Only).

* cited by examiner

LOW LOSS CONDUCTIVE LINE USING BRIDGED CONDUCTOR

BACKGROUND

The subject disclosure relates to quantum circuits. Quantum computing employs quantum physics to encode and process information rather than binary digital techniques based on transistors. A quantum computing device employs quantum bits (also referred to as qubits) that operate according to the laws of quantum physics and can exhibit phenomena such as superposition and entanglement. The superposition principle of quantum physics allows qubits to be in a state that partially represent both a value of "1" and a value of "0" at the same time. The entanglement principle of quantum physics allows qubits to be correlated with each other such that the combined states of the qubits cannot be factored individual qubit states. For instance, a state of a first qubit can depend on a state of a second qubit. As such, a quantum circuit can employ qubits to encode and process information in a manner that can be significantly different from binary digital techniques based on transistors.

With regard to fabrication of quantum circuitry, some quantum circuits can utilize a coplanar waveguide (CWP) as a transmission line for quantum applications. A CWP can comprise the transmission line, which can be a central conductor (e.g., a conductor line) that can be formed on a dielectric substrate, and two return conductor lines that can be formed on the dielectric substrate, with one return conductor line on each side of the central conductor and separated from the central conductor by a relatively small space. A CWP can be utilized to transmit microwave-frequency signals for quantum applications. However, CPWs can have undesirable energy losses (e.g., microwave losses) in the dielectric substrate.

A conventional approach to address such energy losses in the dielectric substrate is to perform partial substrate etching of portions of the substrate in proximity to the spaces between the central conductor and the return conductors of the CWP. However, even with aggressive or deep etching of those portions of the substrate in proximity to the spaces, there still can be a significant and undesirable amount of energy loss in the dielectric substrate. These and other deficiencies of conventional fabrication of quantum circuitry can result in inefficient and/or ineffective circuits and/or inefficient performance of a quantum circuits.

SUMMARY

The following presents a summary to provide a basic understanding of one or more embodiments of the disclosed subject matter. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, structures, computer-implemented methods, apparatuses, and/or computer program products that can facilitate forming electronic devices comprising spiral conductive structures are provided.

According to an embodiment, a device comprises a substrate component. The device also includes a conductor component comprising a bridge portion disposed over a portion of the substrate component, where a gap of a defined distance is formed between the bridge portion of the conductor component and a surface of the portion of the substrate component that is facing the bridge portion. The device can have a number of advantages, including that the device can reduce an amount of energy loss associated with the substrate component.

In some embodiments, the bridge portion can be a first bridge portion, and the conductor component comprises a set of bridge portions, including the first bridge portion and a second bridge portion, and a base conductor portion disposed on the substrate component and situated between the first bridge portion and the second bridge portion. In certain embodiments, the first bridge portion and the second bridge portion can be raised above the base conductor portion and the surface of the substrate component to form gaps, comprising the gap, between the substrate component and the first bridge portion and the second bridge portion. In other embodiments, the portion of the substrate component can be a first portion of the substrate component, the gap can be a first gap, and a first section of the substrate component can be removed to form the first gap between the first portion of the substrate component and the first bridge portion disposed over the first portion of the substrate component, and a second section of the substrate component can be removed to form a second gap between a second portion of the substrate component and the second bridge portion disposed over the second portion of the substrate component. These embodiments of the device can provide a number of advantages, including that the device, by raising the first bridge portion and the second bridge portion above the surface of the substrate component to form gaps, can reduce energy loss associated with the substrate component, and/or the device, by having the first section of the substrate component removed to form the first gap between the first portion of the substrate component and the first bridge portion, and having the second section of the substrate component removed to form the second gap between a second portion of the substrate component and the second bridge portion, can reduce energy loss associated with the substrate component.

Another embodiment relates to a method that comprises forming a substrate. The method also comprises forming a conductor line comprising a bridge conductor portion disposed over a portion of the substrate, where a gap of a defined distance is formed between the bridge conductor portion of the conductor line and a surface of the portion of the substrate that is facing the bridge conductor portion. The method can have a number of advantages, including that the method can reduce an amount of energy loss associated with the substrate.

In certain embodiments, the bridge conductor portion can be a first bridge conductor portion and the method can comprise forming the conductor line comprising a set of bridge conductor portions, including the first bridge conductor portion and a second bridge conductor portion, and a base conductor portion disposed on the substrate and situated between the first bridge conductor portion and the second bridge conductor portion. In some embodiments, the method can include that the first bridge conductor portion and the second bridge conductor portion can be formed at an elevated level relative to the base conductor portion and the surface of the substrate to form gaps, comprising the gap, between the substrate and the first bridge conductor portion and the second bridge conductor portion. In other embodiments, the portion of the substrate can be a first portion of the substrate, the gap can be a first gap, and the method can further comprise removing a first section of the substrate to form the first gap between the first portion of the substrate and the first bridge conductor portion disposed over the first portion of the substrate; and removing a second section of the substrate to form a second gap between a second portion of the substrate and the second bridge conductor portion disposed over the second portion of the substrate. Such embodiments of the method can provide a number of advantages, including that the method, by forming the first bridge conductor portion and the second bridge conductor portion at the elevated level relative to the surface of the substrate to form the gaps, can reduce an amount of energy loss associated with the substrate, and/or the method, by removing the first section of the substrate to form the first gap between the first portion of the substrate and the first bridge conductor portion, and removing the second section of the substrate to form the second gap between the second portion of the substrate and the second bridge conductor portion, can reduce an amount of energy loss associated with the substrate.

A further embodiment relates to a computer program product that facilitates forming a quantum computing circuit, the computer program product comprising a computer readable storage medium having program instructions embodied therewith. The program instructions are executable by a processor to cause the processor to form a substrate comprising a dielectric material to enable creation of circuit components of the quantum computing circuit. The program instructions also are executable by the processor to create a conductor line of the quantum computing circuit to have the conductor line comprise a bridge conductor portion positioned over a portion of the substrate, where a space of a defined distance is formed between the bridge conductor portion of the conductor line and a surface of the portion of the substrate that is facing the bridge conductor portion. The computer program product can have a number of advantages, including that the computer program product can enhance performance of the quantum computing circuit by reducing an amount of energy loss associated with the substrate.

In some embodiments, the bridge conductor portion can be a first bridge conductor portion, where the portion of the substrate can be a first portion of the substrate, where the space can be a first space, and the program instructions can be executable by the processor to cause the processor to: create the conductor line comprising a set of bridge conductor portions, including the first bridge conductor portion and a second bridge conductor portion, and a base conductor portion disposed on the substrate and positioned between the first bridge conductor portion and the second bridge conductor portion. In certain embodiments, the first bridge conductor portion and the second bridge conductor portion can be raised above the base conductor portion and the surface of the substrate to form spaces, comprising the first space, between the substrate and the first bridge conductor portion and the second bridge conductor portion; or a first section of the substrate can be removed to form the first space between the first portion of the substrate and the first bridge conductor portion positioned over the first portion of the substrate, and a second section of the substrate can be removed to form a second space between a second portion of the substrate and the second bridge conductor portion positioned over the second portion of the substrate. These embodiments of the computer program product can provide a number of advantages, including that the computer program product, by raising the first bridge conductor portion and the second bridge conductor portion above the surface of the substrate to form the spaces between the substrate and the first bridge conductor portion and the second bridge conductor portion, and/or the computer program product, by removing the first section of the substrate to form the first space between the first portion of the substrate and the first bridge conductor portion, and removing the second section of the substrate to form the second space between the second portion of the substrate and the second bridge conductor portion, can reduce an amount of energy loss associated with the substrate.

According to still another embodiment, a system can comprise a memory that stores computer-executable components; and a processor, operatively coupled to the memory, that executes computer-executable components. The computer-executable components can comprise a substrate formation component that forms a dielectric substrate as part of a quantum computing circuit. The computer-executable components also can include a conductor formation component that forms a conductor component comprising a bridge conductor portion positioned over a portion of the dielectric substrate component, where a space of a defined distance is formed between the bridge conductor portion of the conductor component and a surface of the portion of the dielectric substrate component that is facing the bridge conductor portion. The system can have a number of advantages, including that the system can reduce an amount of energy loss associated with the dielectric substrate component.

In certain embodiments, the bridge conductor portion can be a first bridge conductor portion, and the conductor formation component can form the conductor component to comprise a set of bridge conductor portions, including the first bridge conductor portion and a second bridge conductor portion, and a base conductor portion, where the base conductor portion can be disposed on the dielectric substrate component and positioned between the first bridge conductor portion and the second bridge conductor portion, and where the first bridge conductor portion and the second bridge conductor portion can be at an elevated level as compared to the base conductor portion and the surface of the dielectric substrate component to form spaces, comprising the space, between the dielectric substrate component and the first bridge conductor portion and the second bridge conductor portion. In other embodiments, the bridge conductor portion can be a first bridge conductor portion, the portion of the dielectric substrate component can be a first portion of the dielectric substrate component, and the space can be a first space, where the substrate formation component can remove a first section of the dielectric substrate component to form the first portion of the dielectric substrate component and form the first space between the first portion of the dielectric substrate component and the first bridge conductor portion positioned over the first portion of the dielectric substrate component, and where the substrate formation component can remove a second section of the dielectric substrate component to form a second portion of the dielectric substrate component and form a second space between the second portion of the dielectric substrate component and the second bridge conductor portion positioned over the second portion of the dielectric substrate component. Such embodiments of the system can provide a number of advantages, including that the system, by having the first bridge conductor portion and the second bridge conductor portion at an elevated level as compared to the surface of the dielectric substrate component to form spaces, and/or the system, by removal of the first section of the dielectric substrate component to form the first space between the first portion of the dielectric substrate component and the first bridge conductor portion, and removal of the second section of the dielectric substrate component to form the second space between the second portion of the dielectric substrate component and the second bridge conductor portion, can reduce an amount of energy loss associated with the dielectric substrate component.

Yet another embodiment relates to a computer program product that facilitates creating a quantum computing circuit, the computer program product comprising a computer readable storage medium having program instructions embodied therewith. The program instructions are executable by a processor to cause the processor to form a dielectric substrate component comprising a dielectric material to enable creation of circuit components of the quantum computing circuit. The program instructions also are executable by the processor to form a conductor component of the quantum computing circuit to have the conductor component comprise a bridge portion disposed over a portion of the dielectric substrate component, where a gap of a defined distance is formed between the bridge portion of the conductor component and a surface of the portion of the substrate component that is facing the bridge portion, and where the conductor component comprises a superconductor material. The computer program product can have a number of advantages, including that the computer program product can enhance performance of the quantum computing circuit by reducing energy loss associated with the dielectric substrate component.

In some example embodiments, the bridge portion can be a first bridge portion, the portion of the dielectric substrate component can be a first portion of the dielectric substrate component, the gap can be a first gap, and the program instructions can be executable by the processor to cause the processor to form the conductor component comprising a group of bridge portions, including the first bridge portion and a second bridge portion, and a base conductor portion disposed on the dielectric substrate component and positioned between the first bridge portion and the second bridge portion, where the first bridge portion and the second bridge portion can be at an elevated level relative to the base conductor portion and the surface of the dielectric substrate component to form gaps, comprising the first gap, between the dielectric substrate component and the first bridge portion and the second bridge portion, or where a first section of the dielectric substrate component can be etched away to form the first gap between the first portion of the dielectric substrate component and the first bridge portion disposed over the first portion of the dielectric substrate component, and a second section of the dielectric substrate component can be etched away to form a second gap between a second portion of the dielectric substrate component and the second bridge portion disposed over the second portion of the dielectric substrate component. These embodiments of the computer program product can provide a number of advantages, including that the computer program product, by having the first bridge portion and the second bridge portion be at the elevated level relative to the surface of the dielectric substrate component to form the gaps, and/or by having the first section of the dielectric substrate component etched away to form the first gap between the first portion of the dielectric substrate component and the first bridge portion, and the second section of the dielectric substrate component etched away to form the second gap between the second portion of the dielectric substrate component and the second bridge portion, can reduce energy loss associated with the dielectric substrate component.

These and other features will become apparent from the following detailed description of illustrative embodiments thereof, which is to be read in connection with the accompanying drawings.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 15:
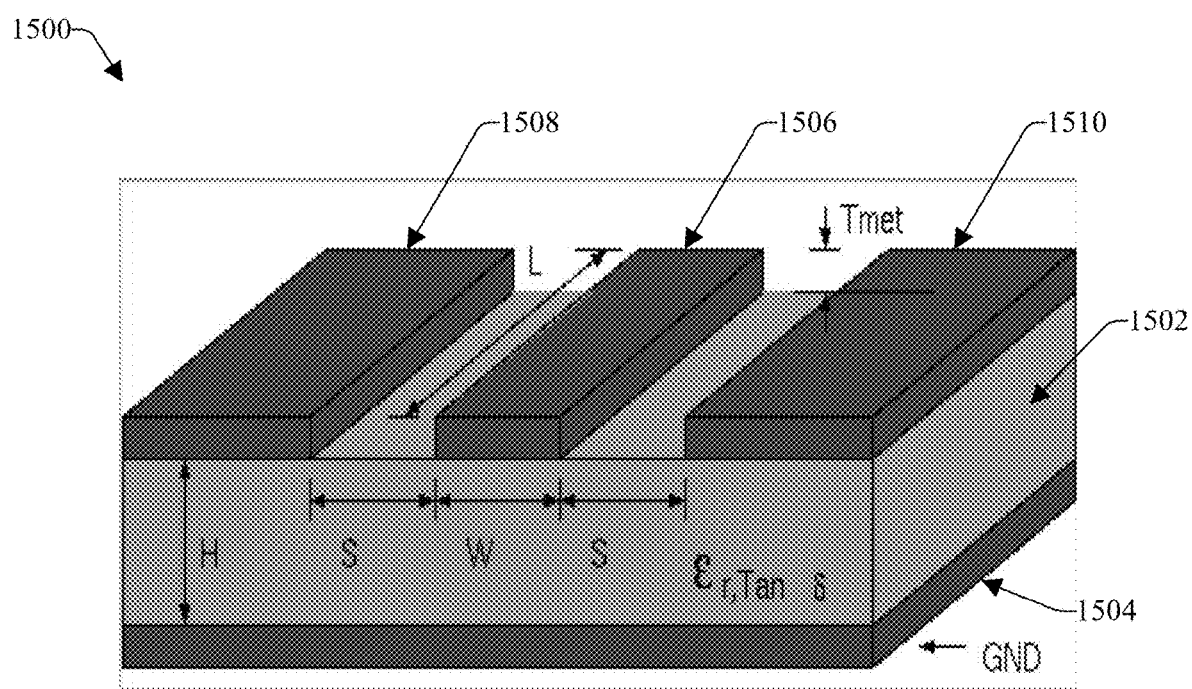
FIG. 15 depicts a diagram of a cross-sectional view of a conventional CWP.

Quantum circuit designs can utilize superconducting quantum devices to perform various functions and operations. With regard to fabrication of quantum circuitry, some quantum circuits can utilize a coplanar waveguide (CWP) as a transmission line for quantum applications. Referring to FIG. 15, FIG. 15 depicts a diagram of a cross-sectional view of a conventional CPW 1500. The CPW 1500 can comprise a substrate 1502 that, as desired, can be formed on a ground plane layer 1504. The substrate 1502 can be formed of a dielectric material, and the ground plane layer 1504 can be formed of a conductive material. The substrate 1502 can have desired dimensions (e.g., length, width, height), and the ground plane layer 1504 also can have desired dimensions, wherein the length and width of the ground plane layer 1504 typically can correspond to the dimensions of the substrate 1502. For example, the substrate 1502 associated with the CPW 1500 can have dimensions, such as a width of approximately 40 micrometers (µm), or more or less than 40 µm, a length (L) that can be the same as or different than the width, and a height (H) of approximately 20 µm, or more or less than 20 µm.

The CPW 1500 can include a central conductor line 1506, which can be a transmission line to transmit signals (e.g. transmit information via signals), that can be formed on the substrate 1502, and two return conductor lines 1508 and 1510 that can be formed on the substrate 1502, with return conductor line 1508 on one side of the central conductor line 1506, return conductor line 1510 on the other side of the central conductor line 1506, wherein the return conductor line 1508 and the return conductor line 1510 each can be separated from the central conductor line 1506 by a desired amount of space (S). The central conductor line 1506 can have a desired width (W), such as, for example, approximately 10 µm or less, and the return conductor lines 1508 and 1510 each can have a width of, for example, approximately 10 µm. The central conductor line 1506 and/or return conductor lines 1508 and 1510 can have a desired thickness ($T_{met}$), such as, for example, approximately 0.2 nanometers (nm). The central conductor line 1506, return conductor lines 1508 and 1510, and/or the ground plane layer 1504 can comprise a desired superconducting material.

A CWP, such as CPW 1500, can be utilized to transmit signals, such as, for example, microwave-frequency signals for quantum applications. However, superconducting quantum devices can be very sensitive to energy losses (e.g., microwave losses) in the dielectric substrate, and CPWs, such as CPW 1500, can have undesirable energy losses (e.g., microwave losses) in the substrate (e.g., dielectric substrate), such as substrate 1502.

Figure 16:
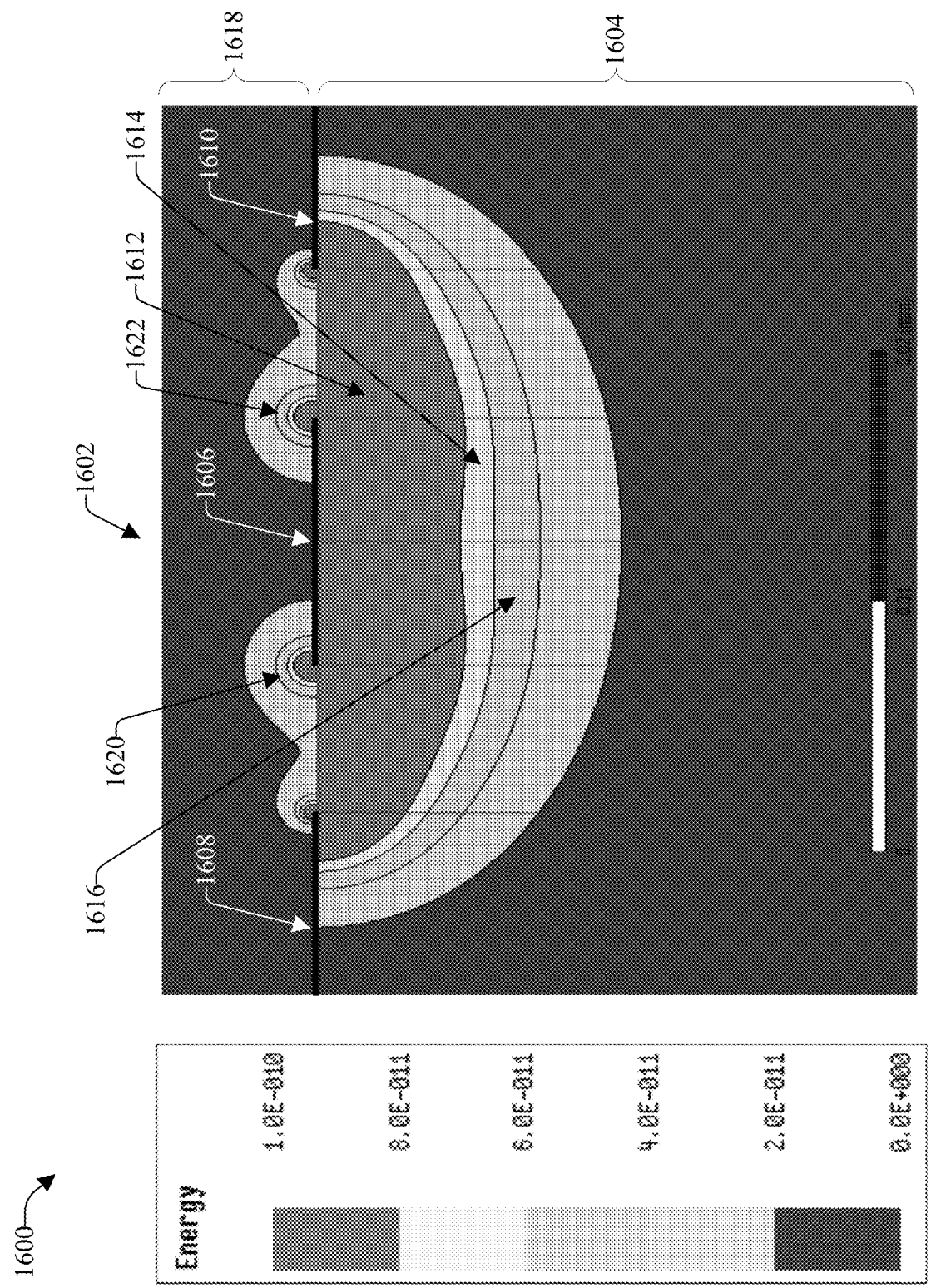
FIG. 16 presents a diagram of an example energy plot of a conventional CWP that can illustrate energy losses associated with the conventional CPW, including energy losses in or associated with the substrate and energy losses associated with the top vacuum region associated with the CPW.

Referring to FIG. 16, FIG. 16 presents a diagram of an example energy plot 1600 of a conventional CWP (e.g., CPW 1500), which can illustrate energy losses associated with a conventional CPW, including energy losses in or associated with the substrate (e.g., substrate 1502) and energy losses associated with the top vacuum region associated with the CPW. The example energy plot 1600 can illustrate the respective amounts of energy in respective regions of or associated with a CPW 1602, which can comprise a substrate 1604 (e.g., silicon-type dielectric substrate) having a height of approximately 20 µm, and a central conductor line 1606 and return conductor lines 1608 and 1610 each comprising the niobium-type superconducting material and having a thickness of approximately 0.2 nm.

As can be observed in the example energy plot 1600, in a conventional CPW 1602, there can be a significant amount of energy in or associated with the substrate 1604. For instance, there can be a relatively (and undesirably) high amount of energy (e.g., ranging from 8.0E-011 to 1.0E-010) in the substrate 1604 in a region 1612 of the substrate 1604 that can be underneath the central conductor line 1606 and part of the return conductor lines 1608 and 1610, spanning from an area underneath part of the return conductor line 1608 across the area underneath the central conductor line 1606 and to an area underneath part of return conductor line 1610, and extending downward approximately 5 µm in the area underneath the central conductor line 1606. There also can be a fairly and still undesirably high amount of energy (e.g., ranging from 6.0E-011 to 8.0E-011) in the substrate 1604 in a region 1614 of the substrate 1604 underneath the central conductor line 1606 and part of the return conductor lines 1608 and 1610, and extending downward from where region 1612 ends deeper into the substrate 1604 for approximately 1 µm. Further, there can be a somewhat lower, but still undesirably high, amount of energy (e.g., ranging from 4.0E-011 to 6.0E-011) in the substrate 1604 in a region 1616 of the substrate 1604 underneath the central conductor line 1606 and part of the return conductor lines 1608 and 1610, and extending downward from where region 1614 ends deeper into the substrate 1604 for approximately 1 µm to 2 µm. There also can be a fairly and still undesirably high amount of energy in parts of the vacuum region 1618 associated with the CPW 1602, such as, for example, in regions 1620 and 1622 associated with (e.g., in proximity to) respective edges (e.g., sides) of the central conductor line 1606 and extending outward approximately 1.5 µm from the respective edges of the central conductor line 1606.

A conventional approach to address energy losses in or associated with a dielectric substrate associated with a CPW can be to perform partial substrate etching of portions of the substrate in proximity to the spaces between the central conductor line and the return conductor lines of the CWP. However, even with aggressive or deep etching of those portions of the substrate in proximity to the spaces, there still can be a significant and undesirable amount of energy loss in the dielectric substrate. These and other deficiencies of conventional fabrication of quantum circuitry can result in inefficient and/or ineffective circuits and/or inefficient performance of a quantum circuits.

The disclosed subject matter can be implemented to produce a solution to all or at least some of these problems and/or other problems with traditional quantum computing circuits, including conventional CPWs, in the form of creating a desirable gap between significant portions of the central conductor line of the CPW and a portion of the substrate that can be underlying or in proximity to the central conductor line. The disclosed subject matter, by creating a desirable gap between significant portions of the central conductor line of the CPW and a portion of the substrate underlying or in proximity to the central conductor line, can mitigate (e.g., reduce or minimize) energy losses (e.g., microwave losses) in or associated with the substrate associated with the CPW and/or energy losses associated with a vacuum region associated with the CPW.

To that end, the various embodiments herein relate to techniques for designing and fabricating quantum circuitry, including CPWs, for quantum applications. In accordance with the disclosed subject matter, with regard to design and fabrication of a CPW, a central conductor line and two return conductor lines can be formed on a dielectric substrate, with one return conductor line on each side of the central conductor line and separated from the central conductor line by a space of a defined size. In some embodiments, the central conductor line can have bridge portions (e.g., bridge conductor portions) of a defined length that can be raised a desired distance above the dielectric substrate and base conductor portions that can be situated between and/or adjacent to the bridge portions and in contact with the surface of the dielectric substrate. Raising the bridge portions the defined distance above the dielectric substrate can form a desired gap (e.g., of the desired distance) between the bridge portions of the central conductor line and the surface of the dielectric substrate. The disclosed subject matter, by raising the bridge portions to form the desired gap between the bridge portions of the central conductor line and the surface of the dielectric substrate, can desirably and significantly reduce energy losses in or associated with the dielectric substrate. Also, in accordance with the disclosed subject matter, the CPW can have the desired amount of impedance (e.g., 50 ohms).

In other embodiments, as an alternative to raising the bridge conductor portions of the central conductor line above the substrate component, the disclosed subject matter can remove (e.g., etch away or otherwise remove) portions of the dielectric substrate underneath the bridge portions of the central conductor line such that the bridge portions of the central conductor line can be a desired distance above the surface of the remaining portions of the dielectric substrate (e.g., the dielectric substrate remaining after removal of the portions of the dielectric substrate), and the base conductor portions of the central conductor line can be in contact with the other portions of the surface of the dielectric substrate that were not removed and are situated between and/or adjacent to the spaces formed by removal of the portions of the dielectric substrate (e.g., situated adjacent to or between the remaining portions of the dielectric substrate). Removing the portions of the dielectric substrate underneath the bridge portions of the central conductor line can form a desired gap (e.g., of the desired distance) between the bridge portions of the central conductor line and the surfaces of the remaining portions of the dielectric substrate. The disclosed subject matter, by removing the portions of the dielectric substrate underneath the bridge portions of the central conductor line to form the desired gap between the bridge portions of the central conductor line and the surfaces of the remaining portions of the dielectric substrate, can desirably and significantly reduce energy losses in or associated with the dielectric substrate and/or energy losses associated with the vacuum region associated with the CPW. Further, in accordance with the disclosed subject matter, the CPW can have the desired amount of impedance (e.g., 50 ohms).

In still other embodiments, the disclosed subject matter can employ a hybrid approach, wherein portions of the dielectric substrate underneath the bridge portions of the central conductor line can be removed and the bridge portions of the central conductor line can be raised (e.g., raised above the dielectric substrate as well as the base conductor portions of the central conductor line) such that the bridge portions of the central conductor line can be the desired distance above the surfaces of the remaining portions of the dielectric substrate (e.g., the dielectric substrate remaining after removal of the portions of the dielectric substrate). For example, if the desired gap between the bridge portions of the central conductor line and the dielectric substrate is 4 µm, the disclosed subject matter can raise the bridge portions of the central conductor line by 2 µm relative to the other portions of the dielectric substrate on which the base conductor portions of the central conductor line are disposed and can remove the portions of the dielectric substrate underneath the bridge portions to a depth of 2 µm to form an overall gap of 4 µm between the bridge portions of the central conductor line and the surfaces of the remaining portions of the dielectric substrate underneath the bridge portions.

It is to be appreciated and understood that, in accordance with various aspects and embodiments of the disclosed subject matter, the desired gap between the bridge portions of the central conductor line and the surfaces of the remaining portions of the dielectric substrate underneath the bridge portions can be 4 µm, or greater than or less than 4 µm, with a range of approximately 1 µm to 10 µm. It also is to be appreciated and understood that, if the hybrid approach is employed, the amount the bridge portions of the central conductor line are raised above the dielectric substrate (e.g., above the other portions of the dielectric substrate on which the base conductor portions of the central conductor line are disposed) can be the same as or different from the depth of the space formed by the removal of the portions of the dielectric substrate underneath the bridge portions of the central conductor line.

These and other aspects and embodiments of the disclosed subject matter will now be described with respect to the drawings.

Figure 1:
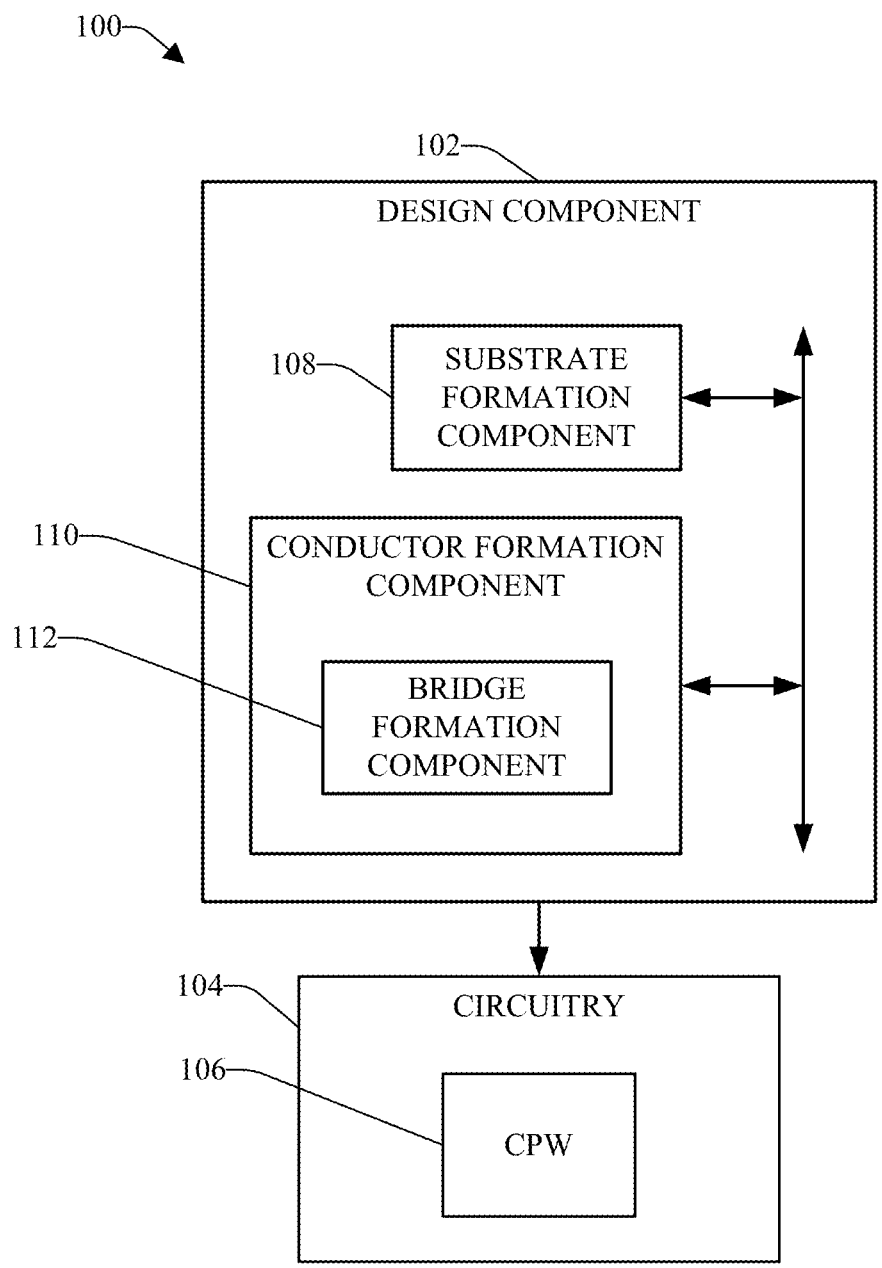
FIG. 1 illustrates a block diagram of an example, non-limiting system 100 that can be utilized to desirably design circuitry comprising coplanar waveguides (CPWs) that can be enhanced to mitigate energy losses, in accordance with various aspects and embodiments of the disclosed subject matter.

FIG. 1 illustrates a block diagram of an example, non-limiting system 100 that can be utilized to desirably design circuitry (e.g., quantum computing circuits) comprising CPWs that can be enhanced to mitigate energy losses, in accordance with various aspects and embodiments of the disclosed subject matter. The system 100 can comprise a design component 102 that can be employed to design circuitry, such as circuitry 104, that can comprise CPWs, such as CPW 106, which can be enhanced to mitigate (e.g., reduce or minimize) energy losses, such as energy losses (e.g., microwave losses) associated with the substrate (e.g., dielectric substrate) of the circuitry 104. For example, the substrate associated with the CPW can have desired dimensions, such a width of approximately 40 µm, or more or less than 40 µm, a length that can be the same as or different than the width, and a height of approximately 20 µm, or more or less than 20 µm. In some embodiments, the circuitry 104 can be or can comprise a quantum computing circuit that can include the CPW 106 and/or a qubit.

The design component 102 can comprise a substrate formation component 108 that can be utilized to form, structure, or construct a substrate component of the CPW 106. The substrate formation component 108 can form the substrate component of a desired dielectric material, and can have desired dimensions (e.g., length, width, and height) and shape. In accordance with various embodiments, the substrate component can be formed of a dielectric material that can have a desirably high thermal conductivity below 1 K.

The design component 102 also can include a conductor formation component 110 that can be employed to form, structure, or construct a conductor component comprising conductors (e.g., central conductor lines, return conductor lines, and/or ground plane layer, . . . ) of the CPW 106 on the substrate component. For instance, the conductor formation component 110 can form the CPW 106 to comprise a central conductor line that can be situated approximately along a center line on the substrate component relative to the return conductor lines, wherein the conductor formation component 110 can form the return conductor lines of the CPW 106 on opposite sides of the central conductor line, with the return conductor lines separate from the central conductor line on the substrate component by a space having a defined size (e.g., defined width, which can be uniform or substantially uniform). The central conductor line and/or return conductor lines each can have a desired thickness (e.g., height). For example, the central conductor line and/or return conductor lines each can have a thickness of approximately 0.2 nm, or another desired thickness on the order of nanometers.

In some embodiments, the conductor formation component 110 can comprise a bridge formation component 112 that can form, structure, or construct the central conductor line that can comprise bridge conductor portions (e.g., a set or sequence of bridge conductor portions) of a defined size (e.g., defined length and defined width) that can be raised a desired distance above the substrate component, and base conductor portions that can be situated between and/or adjacent to the bridge conductor portions and in contact with the surface (e.g., top facing surface) of the substrate component. In accordance with various embodiments, the bridge formation component 112 can raise the bridge conductor portions of the central conductor line above the surface of the substrate component to form gaps of a defined distance, such as 4 µm, or another other desired distance in the range of approximately 1 µm to 10 µm, between the bridge conductor portions and the surface of the substrate component. The disclosed subject matter, by raising the bridge conductor portions to form the desired gap between the bridge conductor portions and the surface of the substrate component, can have an advantage of desirably and significantly mitigating (e.g., reducing or minimizing) energy losses (e.g., microwave losses) in or associated with the substrate component. Also, in accordance with the disclosed subject matter, the conductor formation component 110 can form the CPW 106 to have a desired amount of impedance, such as, for example, 50 ohms.

In other embodiments, as an alternative to raising the bridge conductor portions of the central conductor line above the substrate component, the substrate formation component 108 can remove (e.g., etch away, using chemical etching or other desired etching techniques, or otherwise remove) portions of the substrate component underneath the bridge conductor portions such that the bridge conductor portions can be a desired distance above the surface of the remaining substrate component underneath the bridge conductor portions (e.g., the remaining portions of the substrate component that remain after removal of the portions of the substrate substrate). There can be base conductor portions of the central conductor line that can be situated between and/or adjacent to the bridge conductor portions, and the conductor formation component 110 can form the base conductor portions to be in contact with other portions of the surface of the substrate component that were not removed and are situated between and/or adjacent to the spaces formed by removal of the portions of the substrate component. Removing the portions of the substrate component underneath the bridge conductor portions of the central conductor line can form a desired gap of the desired distance (e.g., 4 µm, or another other desired distance in the range of approximately 1 µm to 10 µm) between the bridge conductor portions and the underlying surfaces of the remaining portions of the substrate component. The disclosed subject matter, by removing the portions of the substrate component underneath the bridge conductor portions of the central conductor line to form the desired gaps between the bridge conductor portions of the central conductor line and the underlying surfaces of the remaining portions of the substrate component, can have an advantage of desirably and significantly mitigating (e.g., reducing or minimizing) energy losses in or associated with the substrate component. Further, in accordance with the disclosed subject matter, the conductor formation component 110 can form the CPW 106 to have a desired amount of impedance (e.g., 50 ohms or other desired impedance).

In still other embodiments, the design component 102 can employ a hybrid approach to form the CPW 106. For instance, the substrate formation component 108 can remove portions of the substrate component that can be situated underneath the bridge conductor portions of the central conductor line (when the central conductor line is formed on the substrate component) to form remaining portions of the substrate component that can be at a desired depth relative to the other portions of the substrate component that can be adjacent to the remaining portions of the substrate component. Also, the bridge formation component 112 can form the bridge conductor portions of the central conductor line to be raised (e.g., raised above the substrate component as well as the base conductor portions of the central conductor line)

such that the bridge conductor portions can be a desired distance above the surface of the underlying remaining portions of the substrate component. For example, if the desired gap between the bridge conductor portions and the substrate component is 4 µm, the substrate formation component 108 (e.g., prior to the formation of the central conductor line) can remove the portions of the substrate component underneath the locations of the bridge conductor portions (e.g., locations where the bridge conductor portions will be) to a depth of 2 µm, and the bridge formation component 112 can raise the bridge conductor portions by 2 µm relative to the other portions of the substrate component on which the base conductor portions of the central conductor line are disposed to form an overall gap of 4 µm between the bridge conductor portions and the surfaces of the underlying remaining portions of the substrate component when the central conductor line, comprising the raised bridge conductor portions, is formed on the substrate component. Further, in accordance with the disclosed subject matter, the conductor formation component 110 can form the CPW 106 to have a desired amount of impedance (e.g., 50 ohms or other desired amount of impedance), as more fully described herein.

It is to be appreciated and understood that, in accordance with various aspects and embodiments of the disclosed subject matter, the desired gap between the bridge conductor portions of the central conductor line and the underlying surfaces of the remaining portions of the substrate component can be 4 µm, or greater or less than 4 µm, with a range of approximately 1 µm to 10 µm. It also is to be appreciated and understood that, if the hybrid approach is employed, the amount the bridge conductor portions are raised above the substrate component (e.g., above the other portions of the substrate component on which the base conductor portions of the central conductor line are disposed) can be the same as or different from the depth of the spaces formed by the removal of the portions of the substrate component underneath the bridge conductor portions of the central conductor line. As a non-limiting example, to achieve overall gaps of 4 µm, the bridge formation component 112 can raise the bridge conductor portions by 3 µm above the other portions of the substrate component on which the base conductor portions are disposed, and the substrate formation component 108 can remove 1 µm deep portions of the substrate component underneath the bridge conductor portions such that the underlying remaining portions of the substrate component can have a depth of 1 µm relative to the other portions of the substrate component adjacent to the remaining portions of the substrate component. As another non-limiting example, to achieve overall gaps of 5 µm, the bridge formation component 112 can raise the bridge conductor portions by 2 µm above the other portions of the substrate component on which the base conductor portions of the central conductor line are disposed, and the substrate formation component 108 can remove 3 µm deep portions of the substrate component underneath the bridge conductor portions such that the underlying remaining portions of the substrate component can have a depth of 3 µm relative to the other portions of the substrate component adjacent to the remaining portions of the substrate component.

Figure 2:
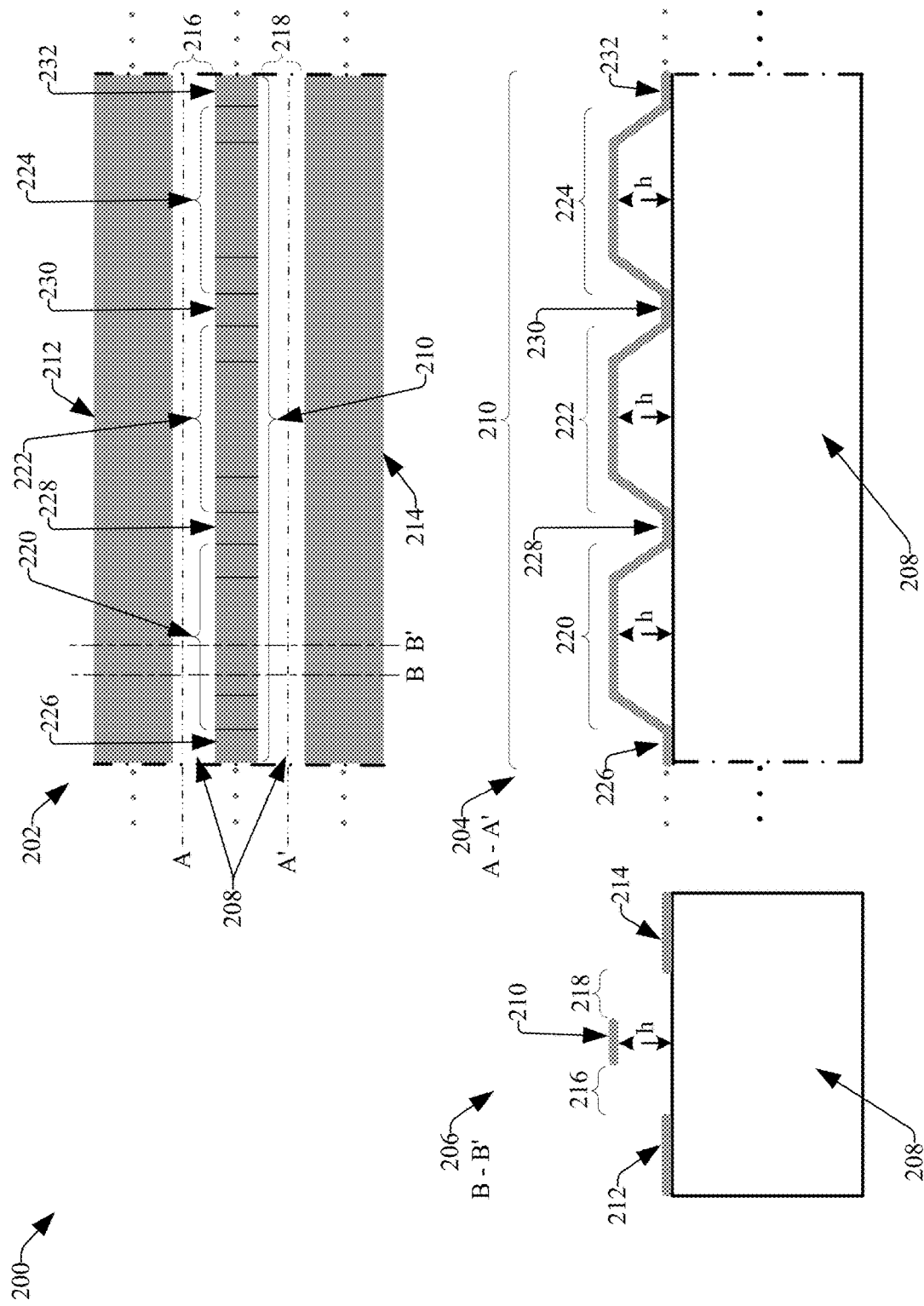
FIG. 2 depicts diagrams of various views of example, non-limiting circuitry that can comprise a CPW that can be enhanced to include bridge conductor portions of a conductor line that can be raised above a substrate to mitigate energy losses, in accordance with various aspects and embodiments of the disclosed subject matter.

Referring to FIG. 2 (along with FIG. 1), FIG. 2 depicts diagrams of various views of example, non-limiting circuitry 200 that can comprise a CPW that can be enhanced to include bridge conductor portions of a conductor line that can be raised above a substrate to mitigate energy losses, in accordance with various aspects and embodiments of the disclosed subject matter. As depicted in the top view 202, cross-sectional side view 204 (view A-A'), and cross-sectional front view 206 (view B-B') of the circuitry 200, the circuitry 200 can be or can comprise a CPW that can include a substrate 208 that can be formed of a desired substrate material, such as a desired dielectric material. The substrate formation component 108 can form the substrate 208 to have a defined size and a defined shape, which can be suitable for the formation of a CPW of the circuitry 200. In some embodiments, the substrate 208 can be a dielectric substrate that can be formed of a dielectric material that can have a thermal conductivity level that can satisfy a defined threshold thermal conductivity level, in accordance with the defined circuit design criteria. For example, the dielectric material of the substrate 208 can have a desirably (e.g., suitably, acceptably, or optimally) high thermal conductivity level below 1 K, in accordance with (e.g., which can satisfy) the defined threshold thermal conductivity level, wherein the desirably high thermal conductivity level can be sufficiently high to be suitable for quantum computing circuitry. Dielectric materials that can have desirably high thermal conductivity level below 1 K can include, for example, silicon, silicon-based material, sapphire, sapphire-based material, or other desirable (e.g., suitable) dielectric material.

The conductor formation component 110 can form a conductor line 210 (also referred to as a central conductor line), which can be a central conductor line of the CPW, that can be associated with (e.g., at least partially in contact with) the substrate 208 (e.g., a surface of the substrate 208) in a desired region of the substrate 208 (e.g., a central or substantially central region of the substrate 208). As part of forming the CPW, the conductor formation component 110 also can form a first return conductor line 212 and a second return conductor line 214 that can be disposed on (e.g., deposited or placed on) the substrate 208 on respective (e.g., opposite or different) sides of the conductor line 210, wherein the first return conductor line 212 can be separated from the central conductor line 210 by a space 216 of a desired size (e.g., a desired width), and wherein the second return conductor line 214 can be separated from the central conductor line 210 by a space 218 of a desired size. In some embodiments, the space 216 and space 218 can be uniform or at least substantially uniform alone the central conductor line 210 and the first and second return conductor lines 212 and 214. The first return conductor line 212 and the second return conductor line 214 each can have desired dimensions (e.g., width, length, and height), which can be suitable for the CPW. In certain embodiments, the central conductor line 210 and/or return conductor lines 212 and 214 each can have a desired thickness (e.g., height). For example, the central conductor line 210 and/or return conductor lines 212 and 214 each can have a thickness of approximately 0.2 nm, or another desired thickness, which can be on the order of nanometers.

The conductor line 210 and/or first and second return conductor lines 212 and 214 can be formed of a desired conductive material to enable transmission of signals (e.g., transmission of signals by the conductor line 210). In some embodiments, the conductor line 210 and/or first and second return conductor lines 212 and 214 can be formed of a superconducting material. For example, the conductor line 210 and/or first and second return conductor lines 212 and 214 can be formed of a superconducting material, such as niobium, niobium-based material, aluminum, aluminum-based material, or other desirable (e.g., suitable) superconducting material.

In accordance with various embodiments, the conductor formation component 110 (e.g., employing the bridge formation component 112) can form the central conductor line 210 to comprise bridge conductor portions, such as bridge conductor portions 220, 222, and 224, and base conductor portions, such as base conductor portions 226, 228, 230, and 232 that can be interspersed with and/or adjacent to the bridge conductor portions along the central conductor line 210. The base conductor portions (e.g., 226, 228, 230, and 232) can be disposed on and in contact with the substrate 208 in the desired region (e.g., a central region) of the substrate 208. The conductor formation component 110 can form the bridge conductor portions (e.g., 220, 222, and 224) to be raised above and disposed over the substrate 208 by a defined distance to form gaps of the defined distance (e.g., a height (h)) between the bridge conductor portions and the substrate 208 to facilitate mitigating (e.g., reducing or minimizing) energy losses (e.g., microwave losses) associated with or in the substrate 208. In some embodiments, the conductor formation component 110 can form or structure the bridge conductor portions (e.g., 220, 222, and 224) to extend upward from an associated (e.g., connected) base conductor portion (e.g., 226, 228, 230, and 232) at a desired angle (e.g., 45°, 60°, 30°, or other desired angle) in relation to the associated (e.g., connected) base conductor portion to the defined distance, wherein each of the bridge conductor portions can extend across the substrate 208 at the defined distance above the substrate 208 for a desired length (e.g., approximately 40 µm, or greater than or less than 40 µm), and wherein each of the bridge conductor portions, at the other end, can extend downward at the desired angle to the adjacent base conductor portion with which it is associated (e.g., connected) at the other end of such bridge conductor portion. In accordance with various embodiments, the bridge formation component 112 can utilize wire forming techniques or air bridge techniques to form the bridge conductor portions 220, 222, and 224 of the central conductor line 210.

In some embodiments, in accordance with the disclosed subject matter, the conductor formation component 110 can form the CPW to have a desired amount of impedance, such as, for example, 50 ohms. For instance, the conductor formation component 110 can adjust the geometry or dimensions (e.g., width and/or thickness) of the central conductor line 210 to achieve the desired amount of impedance.

The disclosed subject matter, by raising the bridge conductor portions (e.g., 220, 222, and 224) above the substrate 208 by the defined distance, can have the advantage of desirably and significantly mitigating (e.g., reducing or minimizing) energy losses in or associated with the substrate 208 and/or energy losses associated with the vacuum region associated with the CPW, as compared to conventional techniques for forming CPWs.

Figure 3:
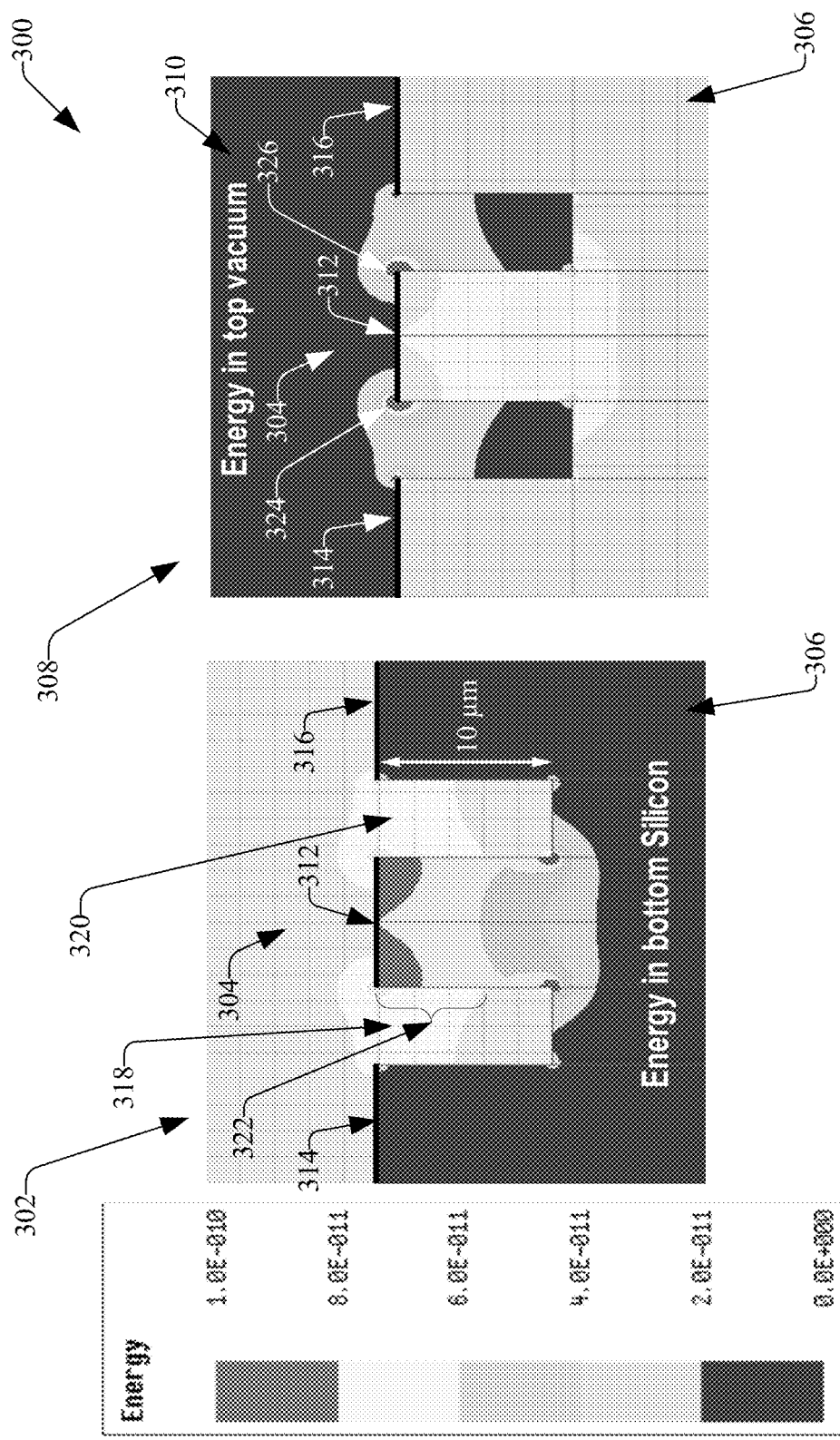
FIG. 3 presents diagrams of example energy plots illustrating energy concentrations of a CPW where substrate portions associated with the spaces between the central conductor line and the return conductor lines are etched away.

Referring briefly to FIG. 3, FIG. 3 presents diagrams of example energy plots 300 illustrating energy concentrations of a CPW where substrate portions associated with the spaces between the central conductor line and the return conductor lines are etched away. The example energy plots 300 can comprise energy plot 302 of a CPW 304 illustrating energy concentrations in various regions of the substrate 306, and energy plot 308 illustrating energy concentrations in various regions of top vacuum 310 associated with the CPW 304. The CPW 304 can comprise the central conductor line 312 and return conductor lines 314 and 316. In this example CPW 304, the substrate portions of the substrate 306 associated with the spaces between the central conductor line 312 and the return conductor lines 314 and 316 can be removed (e.g., etched away) to form the open regions 318 and 320, which can be 10 µm deep relative to the top surface of the substrate 306 associated with (e.g., in contact with) the central conductor line 312 and the return conductor lines 314 and 316. As can be observed in the energy plot 302, even with the substrate portions of the substrate 306 removed to create the open regions 318 and 320, there still can be a significant and undesirable amount (e.g., most) of energy (e.g., electromagnetic field energy) in the substrate 306, including at region 322, after the removal of the substrate portions. As can be observed in the energy plot 308, even with the substrate portions of the substrate 306 removed to create the open regions 318 and 320, there still can be a significant and undesirable amount of energy in the top vacuum 310 associated with the CPW 304, particularly in proximity to the central conductor line 312 (e.g., in regions 324 and 326).

Figure 4:
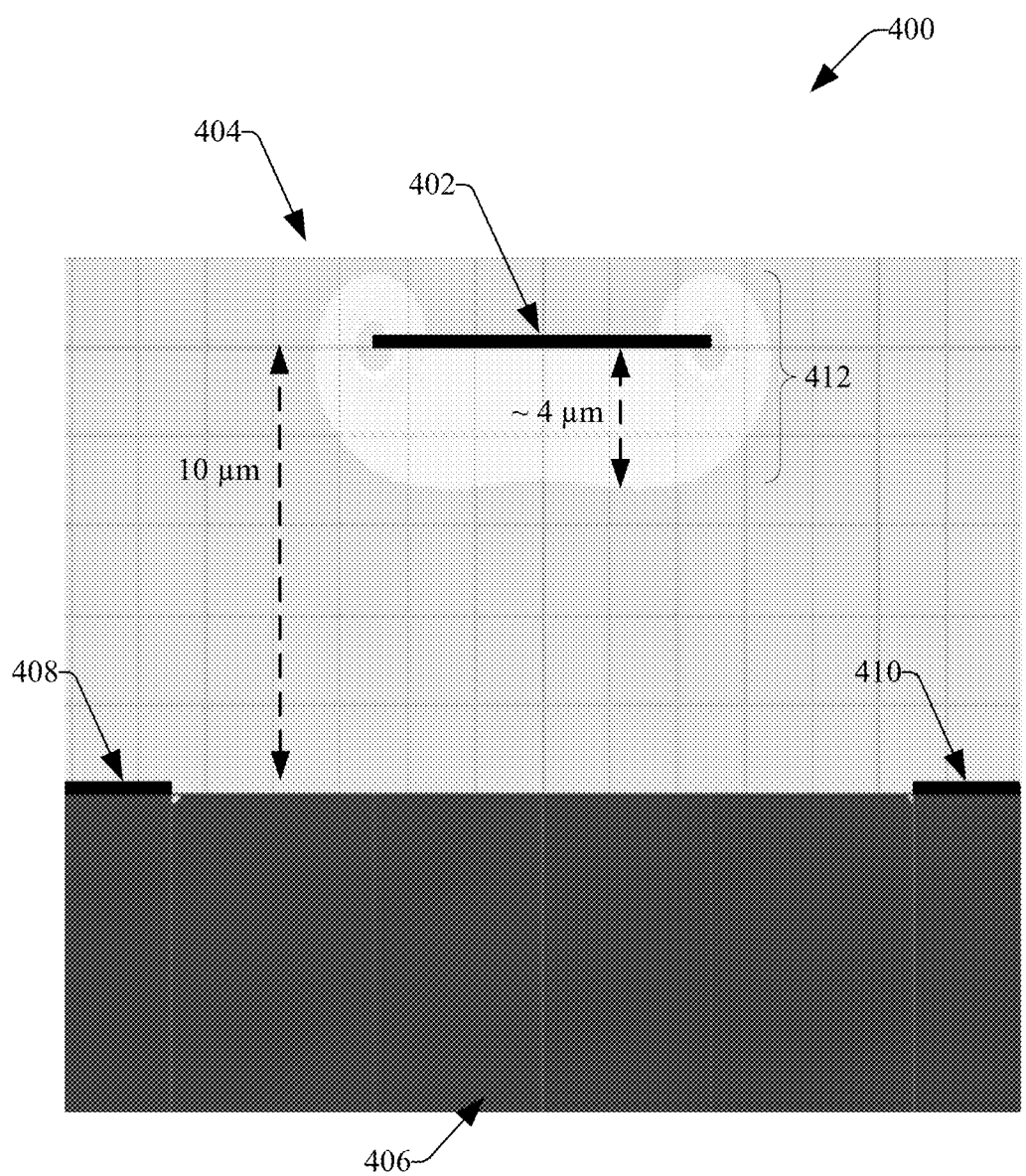
FIG. 4 depicts a diagram of an energy plot illustrating energy concentrations of a CPW where a bridge conductor portion of the central conductor line of a CPW is elevated above the substrate by a desired distance, in accordance with various aspects and embodiments of the disclosed subject matter.

Turning briefly to FIG. 4, FIG. 4 depicts a diagram of an energy plot 400 illustrating energy concentrations of a CPW where a bridge conductor portion of the central conductor line of a CPW is elevated above the substrate by a desired distance, in accordance with various aspects and embodiments of the disclosed subject matter. A bridge conductor portion 402 of the central conductor line of the CPW 404 can be a desired distance, such as 10 µm above the substrate 406. The CPW 404 also can include return conductor lines 408 and 410 that can be on opposite sides of the central conductor line, with respective spaces in between the central conductor line (including the bridge conductor portion 402) and the return conductor lines 408 and 410. As can be observed in the energy plot 400, by raising the bridge conductor portion 402 by the desired distance of 10 µm above the substrate 406, there can be no or virtually no (e.g., a very small or minimal amount of) energy in the substrate 406, and there can be only a relatively small amount of energy (e.g., electromagnetic field energy) in the top vacuum, primarily in the region 412 in proximity to the bridge conductor portion 402 (e.g., with the region 412, in part, extending downward from the bridge conductor portion 402 by approximately 4 µm. The example energy plot 400 shows that creating a gap of a desired distance between a bridge conductor portion (e.g., 402) of a central conductor line of a CPW and the substrate can mitigate (e.g., reduce or minimize) energy loss in or associated with the substrate.

Figure 5:
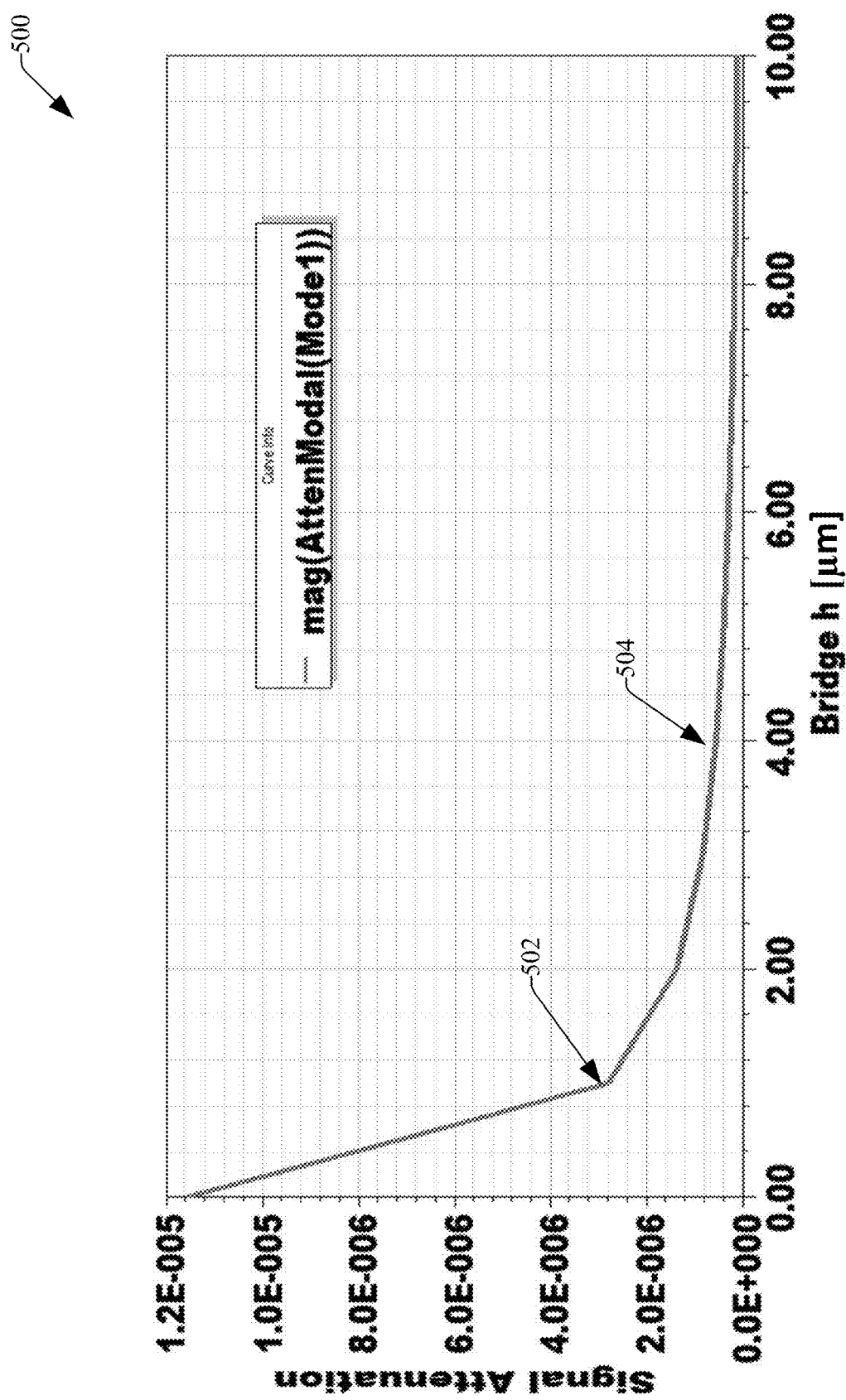
FIG. 5 illustrates a diagram of an example graph of signal attenuation as a function bridge height of a bridge conductor portion with regard to a central conductor line of a CPW, in accordance with various aspects and embodiments of the disclosed subject matter.

Turning briefly to FIG. 5, FIG. 5 illustrates a diagram of an example graph 500 of signal attenuation as a function of bridge height of a bridge conductor portion with regard to a central conductor line of a CPW, in accordance with various aspects and embodiments of the disclosed subject matter. As can be observed from the graph 500, as the height (h) of the bridge conductor portion of the central conductor line of the CPW above the substrate is increased, the amount of signal attenuation can be reduced significantly. For instance, as can be seen in the graph 500, even with the bridge conductor portion being raised to a height of 1 µm above the substrate, there already can be significant reduction in signal attenuation (as illustrated at reference numeral 502 of the graph 500). As also can be seen in the graph 500, with the bridge conductor portion being raised to a height of 4 µm above the substrate, there can be even further reduction in the amount of signal attenuation (as illustrated at reference numeral 504 of the graph 500) as compared to the signal attenuation reduction associated with the height of 1 µm for the bridge conductor portion with respect to the substrate, wherein even more reduction in signal attenuation can be achieved at heights of greater than 4 µm for the bridge conduction portion. These graphical results of the graph 500 with regard to the reduction of signal attenuation as a function of the height of the bridge conductor portion above the substrate can correspond to (e.g., correlate with) the significant and increasing mitigation (e.g., reduction) of energy loss in or associated with the substrate as the bridge conductor portions of the central conductor line of the CPW are raised or otherwise separated further and further above or from the substrate.

Figure 6:
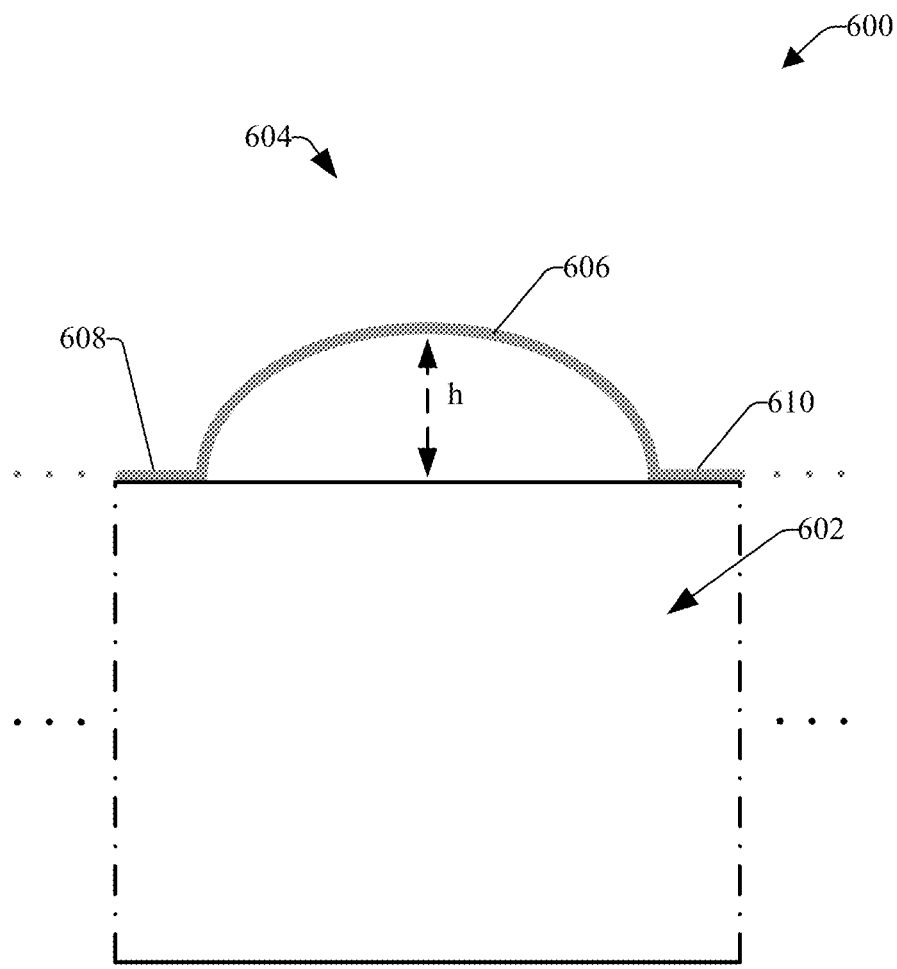
FIG. 6 illustrates a diagram of an example portion of a CPW that can comprise a bridge conductor portion of a central conductor line of a CPW, wherein the bridge conductor portion can be formed to have a rounded shape, in accordance with various aspects and embodiments of the disclosed subject matter.

Referring again to FIG. 2, while, in FIG. 2, the bridge conductor portions (e.g., 220, 222, and 224) of the conductor line 210 are shown and described as being formed to extend upward and downward at a desired angle (e.g., 45°, 60°, 30°, or other desired angle), in accordance with the disclosed subject matter, the bridge conductor portions can be formed and/or shaped differently than depicted in FIG. 2. As a non-limiting example, referring briefly to FIG. 6 (along with FIG. 1), FIG. 6 illustrates a diagram of an example portion of a CPW 600 that can comprise a bridge conductor portion of a central conductor line of a CPW, wherein the bridge conductor portion can be formed to have a rounded shape, in accordance with various aspects and embodiments of the disclosed subject matter. The example portion of a CPW 600 can comprise a substrate 602 that can be formed of a desired substrate material (e.g., dielectric material, such as described herein). The conductor formation component 110 can form a central conductor line 604 that can be disposed on or over the substrate 602. The conductor formation component 110, employing the bridge formation component 112, can form the central conductor line 604 to comprise the bridge conductor portion 606 and base conductor portions 608 and 610, which can be on each side of (e.g., adjacent and connected to) the bridge conductor portion 606 and can be disposed on and/or in contact with the substrate 602. In some embodiments, the conductor formation component 110 (e.g., employing the bridge formation component 112) can form the bridge conductor portion 606 to have a rounded shape (e.g., semi-circular or semi-elliptical shape) that can extend upward from the base conductor portion 608 and substrate 602 to a defined distance (e.g., a desired height (h)) above the substrate 602, extending over and across the substrate for a defined length (e.g., approximately 40 μm, or more or less than 40 μm), and extending downward to the base conductor portion 610.

Figure 7:
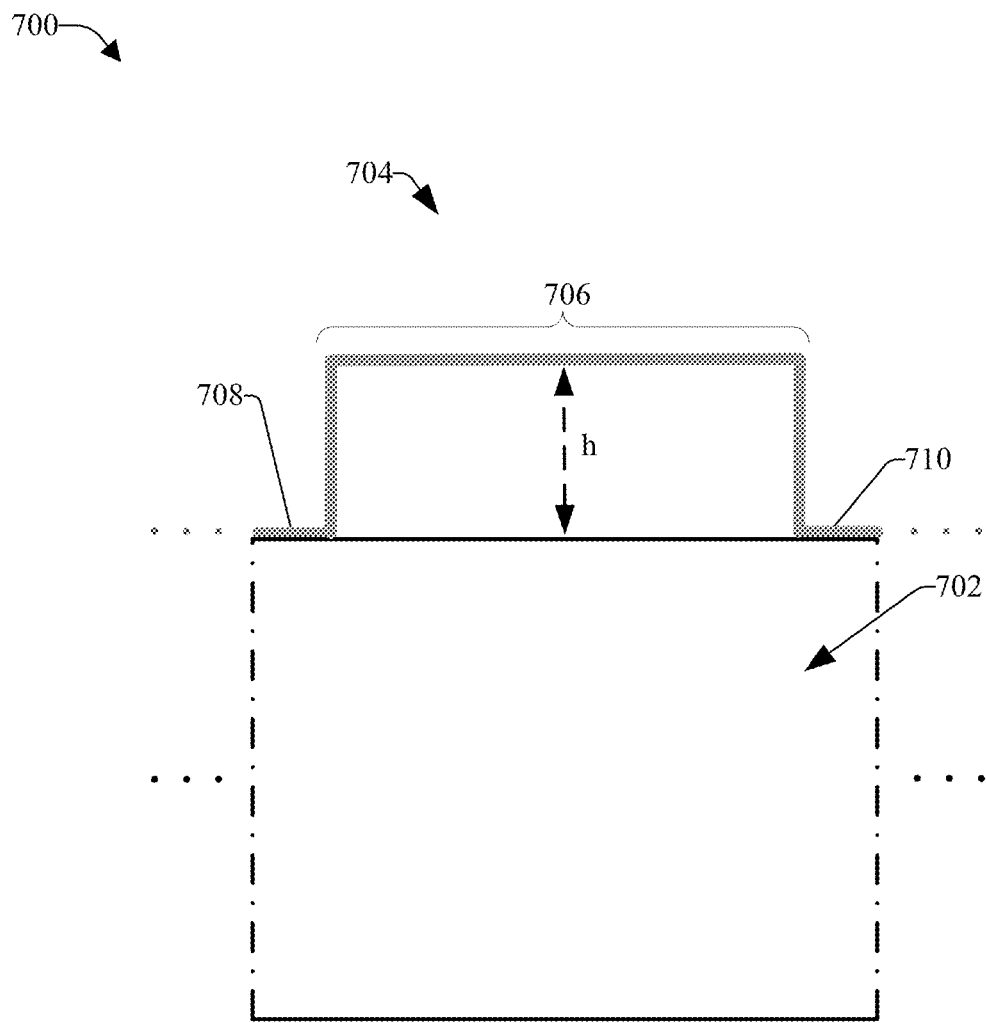
FIG. 7 illustrates a diagram of an example portion of a CPW that can comprise a bridge conductor portion of a central conductor line of a CPW, wherein the bridge conductor portion can be formed to have a semi-rectangular shape, in accordance with various aspects and embodiments of the disclosed subject matter.

As another non-limiting example, referring briefly to FIG. 7 (along with FIG. 1), FIG. 7 illustrates a diagram of an example portion of a CPW 700 that can comprise a bridge conductor portion of a central conductor line of a CPW, wherein the bridge conductor portion can be formed to have a semi-rectangular shape, in accordance with various aspects and embodiments of the disclosed subject matter. The example portion of the CPW 700 can comprise a substrate 702 that can be formed of a desired substrate material (e.g., dielectric material, such as described herein). The conductor formation component 110 can form a central conductor line 704 that can be disposed on or over the substrate 702. The conductor formation component 110, employing the bridge formation component 112, can form the central conductor line 704 to comprise the bridge conductor portion 706 and base conductor portions 708 and 710, which can be on each side of (e.g., adjacent and connected to) the bridge conductor portion 706 and can be disposed on and/or in contact with the substrate 702. In some embodiments, the conductor formation component 110 (e.g., employing the bridge formation component 112) can form the bridge conductor portion 706 to have a semi-rectangular shape that can extend upward from the base conductor portion 708 and substrate 702 at a right angle (e.g., a 90°) or substantially a right angle up to a defined distance (e.g., a desired height (h)) above the substrate 702, extending over and across the substrate for a defined length (e.g., approximately 40 μm, or more or less than 40 μm), and extending downward at a right angle or a substantially right angle to the base conductor portion 710.

Figure 8:
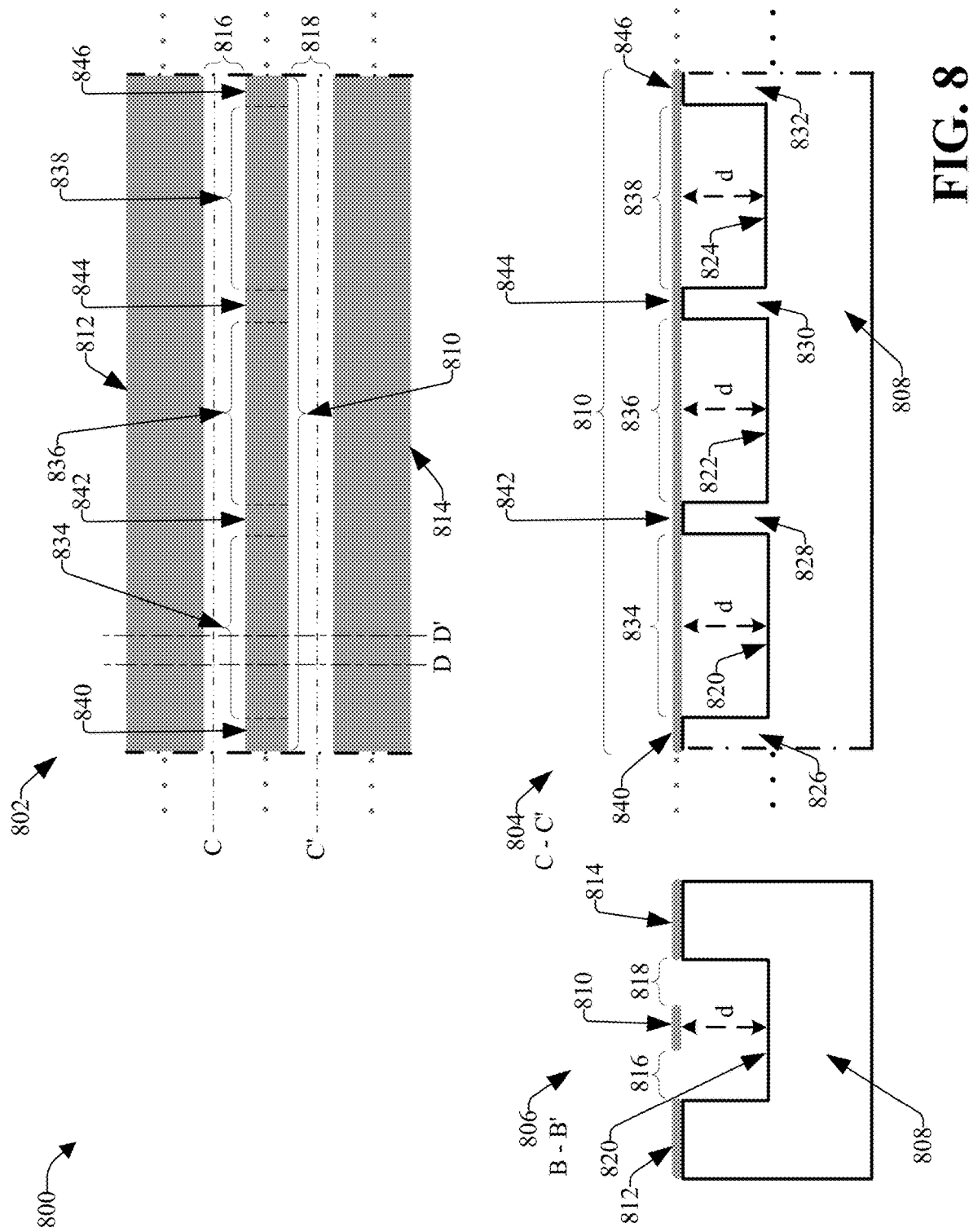
FIG. 8 illustrates diagrams of various views of example, non-limiting circuitry that can comprise a CPW that can be enhanced to include bridge conductor portions of a central conductor line that can be disposed over remaining portions of a substrate that can remain after removal of portions of the substrate, in order to mitigate energy losses in or associated with the substrate, in accordance with various aspects and embodiments of the disclosed subject matter.

Referring to FIG. 8 (along with FIG. 1), FIG. 8 illustrates diagrams of various views of example, non-limiting circuitry 800 that can comprise a CPW that can be enhanced to include bridge conductor portions of a central conductor line that can be disposed over remaining portions of a substrate that can remain after removal of portions of the substrate, in order to mitigate energy losses in or associated with the substrate, in accordance with various aspects and embodiments of the disclosed subject matter. As depicted in the top view 802, cross-sectional side view 804 (view C-C'), and cross-sectional front view 806 (view D-D') of the circuitry 800, the circuitry 800 can be or can comprise a CPW that can include a substrate 808 that can be formed of a desired substrate material, such as a desired dielectric material. The substrate formation component 108 can form the substrate 808 to have a defined size and a defined shape, which can be suitable for the formation of a CPW of the circuitry 800. In some embodiments, the substrate 808 can be a dielectric substrate that can be formed of a dielectric material (e.g., silicon or sapphire type material) that can have a thermal conductivity level that can satisfy a defined threshold thermal conductivity level, in accordance with the defined circuit design criteria. For example, the dielectric material of the substrate 808 can have a desirably (e.g., suitably, acceptably, or optimally) high thermal conductivity level below 1 K, in accordance with (e.g., which can satisfy) the defined threshold thermal conductivity level.

The conductor formation component 110 can form a conductor line 810, which can be the central conductor line of the CPW, that can be associated with (e.g., at least partially in contact with) the substrate 808 (e.g., a surface of the substrate 808) in a desired region of the substrate 808 (e.g., a central or substantially central region of the substrate 808). As part of forming the CPW, the conductor formation component 110 can form a first return conductor line 812 and a second return conductor line 814 that can be disposed on (e.g., deposited or placed on) the substrate 808 on opposite or adjacent sides of the conductor line 810, wherein the first return conductor line 812 can be separated from the central conductor line 810 by a space 816 of a desired size, and wherein the second return conductor line 814 can be separated from the central conductor line 810 by a space 818 of a desired size (e.g., width). The first return conductor line 812 and the second return conductor line 814 each can have a desired width and length, which can be suitable for the CPW.

The conductor line 810 and/or first and second return conductor lines 812 and 814 can be formed of a desired conductive material (e.g., a superconducting material or other desired conductive material) to enable transmission of signals (e.g., transmission of signals by the conductor line 810). For example, the conductor line 810 and/or first and second return conductor lines 812 and 814 can be formed of a superconducting material, such as a niobium-type material or aluminum-type superconducting material.

In accordance with various embodiments, to facilitate forming the CPW (e.g., enhanced CPW), the substrate formation component 108 can form the substrate 808 to remove (e.g., etch away) portions of the substrate 808 in the desired region of the substrate 808 on or over which the central conductor line 810 can be disposed such that there can be remaining portions of the substrate 808, including remaining portions 820, 822, and 824 of the substrate 808, that can be a desired depth below the other portions 826, 828, 830, and 832 of the substrate 808 that can be between and/or adjacent to the remaining portions 820, 822, and 824 of the substrate 808. The length and width of the remaining portions 820, 822, and 824 of the substrate 808 can be as desired, in accordance with the defined circuit design criteria. For instance, the length of each of the remaining portions 820, 822, and 824 can be relatively longer (e.g., significantly longer) than the length of each of the other portions 826, 828, 830, and 832 of the substrate 808. In some of the embodiments, the width of the remaining portions 820, 822, and 824 of the substrate 808 can extend from the substrate portion underneath the return conductor line 812 to another substrate portion underneath the return conductor line 814 (as depicted in cross-sectional front view 806 (view B-B') of the circuitry 800 of FIG. 8). In other embodiments, the width of a remaining portion (e.g., 820, 822, or 824) of the substrate 808 can be smaller such that the substrate can extend beyond the overlaying return conductor lines 812 and 814 towards the central conductor line 810. The depth of the remaining portions 820, 822, and 824 relative to the height of the other portions 826, 828, 830, and 832 of the substrate 808 and the overlaying central conductor line 810 can be as desired, in accordance with the defined circuit design criteria, for example, to achieve the desired mitigation of energy losses in or associated with the substrate 808. In accordance with various embodiments, the depth of the remaining portions 820, 822, and 824 of the substrate 808 can range from approximately 1 μm to approximately 10 μm. In one example embodiment, the depth of the remaining portions 820, 822, and 824 can be 4 μm.

In accordance with various embodiments, the conductor formation component 110 can form the central conductor line 810 to comprise bridge conductor portions, such as bridge conductor portions 834, 836, and 838, and base conductor portions, such as base conductor portions 840, 842, 844, and 846, that can be interspersed with or adjacent to the bridge conductor portions along the central conductor line 810. Respective base conductor portions (e.g., 840, 842, 844, and 846) can be disposed on and in contact with respective other portions 826, 828, 830, and 832 of the substrate 808 in the desired region of the substrate 808, with respective bridge conductor portions 834, 836, and 838 of the central conductor line 810 being disposed over respective remaining portions 820, 822, and 824 of the substrate 808. In accordance with some embodiments, the central conductor line 810 can be flat or substantially flat such that the bridge conductor portions and base conductor portions of the central conductor line can be at the same level in relation to each other.

Given the depth of the remaining portions 820, 822, and 824 of the substrate 808, there can be respective gaps of a defined distance (d) (e.g., distance equal to the depth of the remaining portions 820, 822, and 824) between the respective surfaces (e.g., top facing surfaces) of the remaining portions 820, 822, and 824 of the substrate 808 and the respective surfaces (e.g., bottom facing surfaces) of the bridge conductor portions 834, 836, and 838 of the central conductor line 810. The disclosed subject matter, by removing portions of the substrate 808 to form the remaining portions 820, 822, and 824 to thereby form gaps of the defined distance between the remaining portions 820, 822, and 824 and the bridge conductor portions of 834, 836, and 838, can have an advantage of desirably and significantly mitigating (e.g., reducing or minimizing) energy losses in or associated with the substrate 808 and/or energy losses associated with the vacuum region associated with the CPW, as compared to conventional techniques for forming CPWs.

In some embodiments, in accordance with the disclosed subject matter, the conductor formation component 110 can form the CPW to have a desired amount of impedance (e.g., 50 ohms or other desired impedance). For instance, the conductor formation component 110 can adjust the geometry or dimensions (e.g., width and/or thickness) of the central conductor line 810 to achieve the desired amount of impedance to counter or mitigate any impedance changes that could occur due to the etching to remove the portions of the substrate 808.

Figure 9:
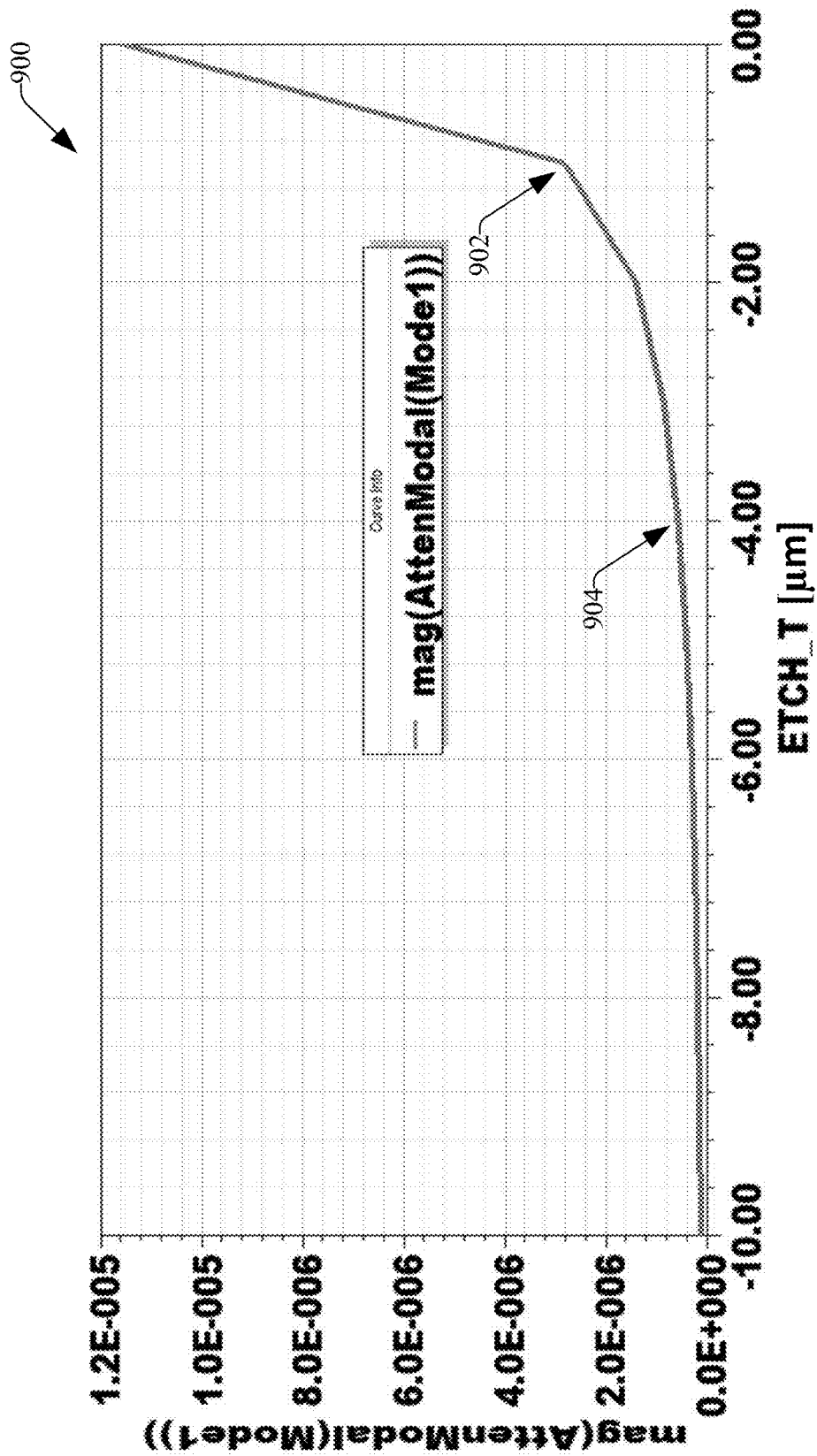
FIG. 9 presents a diagram of an example graph of signal attenuation as a function etching depth of etching of a portion of a substrate that is situated underneath a bridge conductor portion of a central conductor line of a CPW, in accordance with various aspects and embodiments of the disclosed subject matter.

Referring briefly to FIG. 9, FIG. 9 presents a diagram of an example graph 900 of signal attenuation as a function etching depth of etching of a portion of a substrate that is situated underneath a bridge conductor portion of a central conductor line of a CPW, in accordance with various aspects and embodiments of the disclosed subject matter. As can be observed from the graph 900, as the depth of the etching of the portion of the substrate underneath the bridge conductor portion of the central conductor line is increased, the amount of signal attenuation can be reduced significantly. For example, as can be observed in the graph 900, even with a 1 μm portion of the substrate underneath the bridge conductor portion of the central conductor line being removed to form a gap of 1 μm between the bridge conductor portion and the underlying remaining portion of the substrate, there already can be significant reduction in signal attenuation (as illustrated at reference numeral 902 of the graph 900). As also can be seen in the graph 900, with a 4 μm portion of the substrate underneath the bridge conductor portion of the central conductor line being removed to form a gap of 4 μm between the bridge conductor portion and the underlying remaining portion of the substrate, there can be even further reduction in the amount of signal attenuation (as illustrated at reference numeral 904 of the graph 900) as compared to the signal attenuation reduction associated with the gap of 1 μm between the bridge conductor portion and the remaining portion of the substrate, wherein even more reduction in signal attenuation can be achieved at gaps of greater than 4 μm between the bridge conduction portion and the remaining portion of the substrate. These graphical results of the graph 900 with regard to the reduction of signal attenuation as a function of the gap between the bridge conductor portion and the remaining portion of the substrate can correspond to (e.g., correlate with) the significant and increasing mitigation (e.g., reduction) of energy loss in or associated with the substrate as the gaps between the bridge conductor portions of the central conductor line of the CPW and the underlying remaining portions of the substrate are increased more and more.

Figure 10:
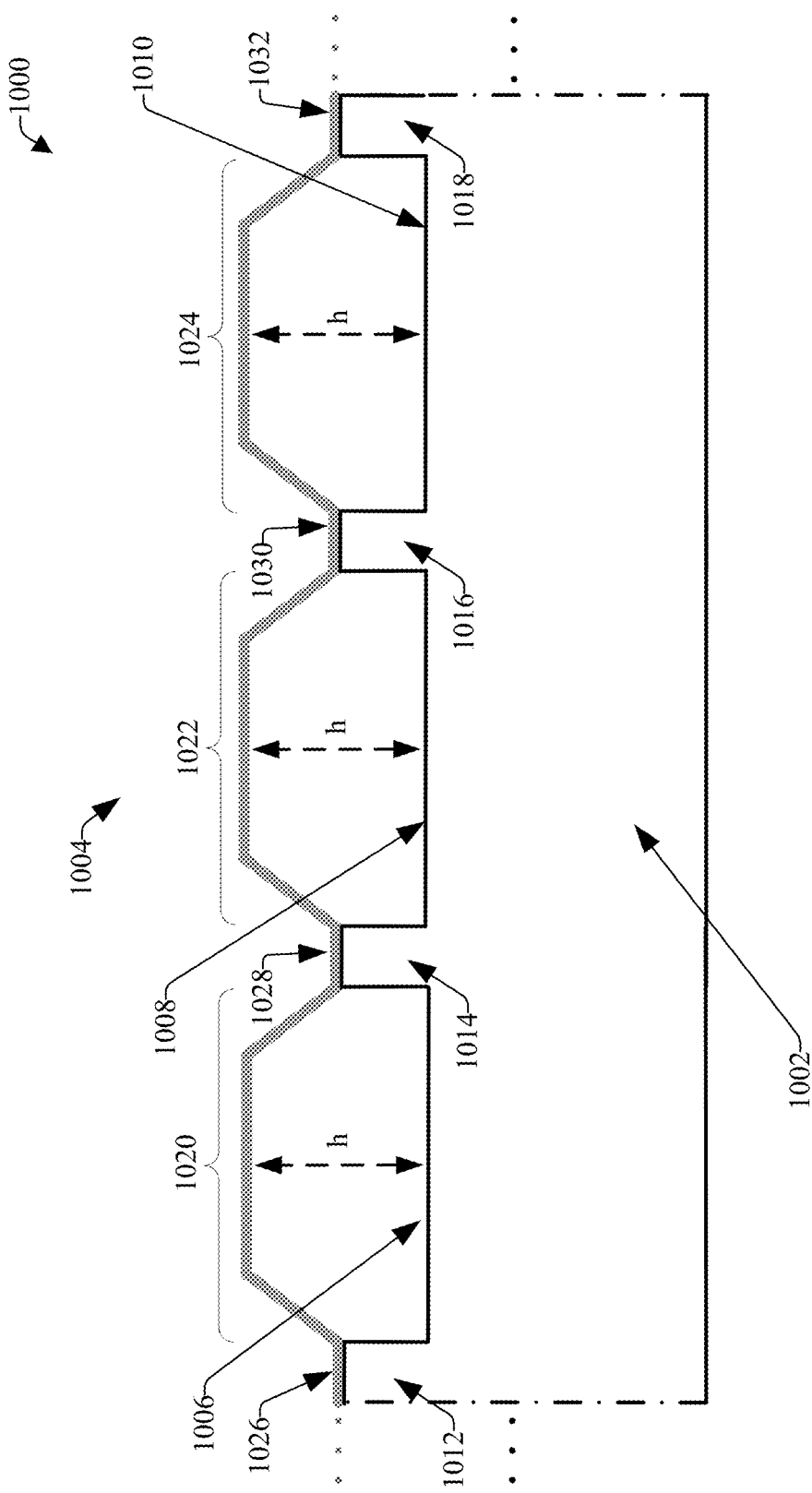
FIG. 10 depicts a diagram of cross-sectional side view of example, non-limiting circuitry that can comprise a CPW that can be enhanced to include bridge conductor portions of a conductor line that can be raised above remaining portions of a substrate, where portions of the substrate can be removed to form the remaining portions of the substrate, to form desired gaps of a desired distance between the bridge conductor portions and corresponding remaining portions of the substrate, to mitigate energy losses, in accordance with various aspects and embodiments of the disclosed subject matter.

In accordance with various embodiments, the disclosed subject matter can employ a hybrid approach where bridge conductor portions of the central conductor line of a CPW can be raised above the substrate to a certain height and portions of the substrate underneath the bridge conductor portions can be removed to a certain depth to form gaps between the bridge conductor portions and the remaining portions of the substrate (e.g., having surfaces at the certain depth) of a desired distance (e.g., overall gap height). Referring briefly to FIG. 10 (along with FIG. 1), FIG. 10 depicts a diagram of cross-sectional side view of example, non-limiting circuitry 1000 that can comprise a CPW that can be enhanced to include bridge conductor portions of a conductor line that can be raised above remaining portions of a substrate, where portions of the substrate can be removed to form the remaining portions of the substrate, to form desired gaps of a desired distance between the bridge conductor portions and corresponding remaining portions of the substrate, to mitigate energy losses, in accordance with various aspects and embodiments of the disclosed subject matter.

As depicted in the cross-sectional side view of example, non-limiting circuitry 1000, the circuitry 1000 can be or can comprise a CPW that can include a substrate 1002 that can be formed of a desired substrate material, such as a desired dielectric material, as more fully described herein. The substrate formation component 108 can form the substrate 1002 to have a defined size and a defined shape, which can be suitable for the formation of a CPW of the circuitry 1000.

The conductor formation component 110 can form a conductor line 1004, which can be the central conductor line of the CPW, that can be associated with (e.g., at least partially in contact with) the substrate 1002 (e.g., a surface of the substrate 1002) in a desired region of the substrate 1002 (e.g., a central or substantially central region of the substrate 1002). As part of forming the CPW, the conductor formation component 110 can form return conductor lines (not shown in FIG. 10) that can be disposed on (e.g., deposited or placed on) the substrate 1002 on opposite or adjacent sides of the conductor line 1004, wherein the return conductor lines can be separated from the central conductor line 1004 by respective spaces of a desired size (e.g., width).

In accordance with various embodiments, to facilitate forming the CPW (e.g., enhanced CPW), the substrate formation component 108 can form the substrate 1002 to remove (e.g., etch away) portions of the substrate 1002 in the desired region of the substrate 808 on or over which the central conductor line 1004 can be disposed such that there can be remaining portions of the substrate 1002, including remaining portions 1006, 1008, and 1010 of the substrate 1002, that can be a desired depth below the other portions 1012, 1014, 1016, and 1018 of the substrate 1002 that can be adjacent to the remaining portions 1006, 1008, and 1010 of the substrate 1002. The length and width of the remaining portions 1006, 1008, and 1010 of the substrate 1002 can be as desired, in accordance with the defined circuit design criteria. For instance, the length of each of the remaining portions 1006, 1008, and 1010 of the substrate 1002 can be relatively longer (e.g., significantly longer) than the length of each of the other portions 1012, 1014, 1016, and 1018 of the substrate 1002. In some of the embodiments, the width of the remaining portions 1006, 1008, and 1010 of the substrate 1002 can extend from the substrate portion underneath the first return conductor line to another substrate portion underneath the second return conductor line. In other embodiments, the width of a remaining portion (e.g., 1006, 1008, and 1010) of the substrate 1002 can be smaller such that the substrate can extend beyond the overlaying return conductor lines towards the central conductor line 1004. The depth of the remaining portions 1006, 1008, and 1010 of the substrate 1002 relative to the height of the other portions 1012, 1014, 1016, and 1018 of the substrate 1002 and the overlaying central conductor line 1004 can be as desired, in accordance with the defined circuit design criteria, for example, to achieve the desired mitigation of energy losses in or associated with the substrate 1002.

In some embodiments, in addition to removing portions of the substrate 1002 to form the remaining portions 1006, 1008, and 1010 of the substrate 1002 of a desired depth, bridge conductor portions of the central conductor line 1004 can be raised to a desired height above the substrate 1002. For instance, the conductor formation component 110 (e.g., employing the bridge formation component 112) can form the central conductor line 1004 to comprise bridge conductor portions, such as bridge conductor portions 1020, 1022, and 1024, and base conductor portions, such as base conductor portions 1026, 1028, 1030, and 1032 that can be interspersed with and/or adjacent to the bridge conductor portions along the central conductor line 1004. The conductor formation component 110 can form the base conductor portions (e.g., 1026, 1028, 1030, and 1032) to have them disposed on and in contact with the substrate 1002 in the desired region (e.g., a central region) of the substrate 1002. The conductor formation component 110 (e.g., employing the bridge formation component 112) can form the respective bridge conductor portions 1020, 1022, and 1024 of the central conductor line 1004 to be raised above and disposed over the respective remaining portions 1006, 1008, and 1010 of the substrate 1002. In certain embodiments, the conductor formation component 110 (e.g., employing the bridge formation component 112) can form or structure the bridge conductor portions (e.g., 1020, 1022, and 1024) to extend upward from an associated (e.g., connected) base conductor portion (e.g., 1026, 1028, 1030, and 1032) at a desired angle (e.g., 45°, 60°, 30°, or other desired angle) in relation to the associated (e.g., connected) base conductor portion to the desired amount of elevation, wherein each of the bridge conductor portions can extend across the substrate 1002 at the desired amount of elevation for a desired length (e.g., approximately 40 μm, or greater than or less than 40 μm), and wherein each of the bridge conductor portions, at the other end, can extend downward at the desired angle to the adjacent base conductor portion of the central conductor line 1004 with which it is associated (e.g., connected) at the other end of such bridge conductor portion.

In some embodiments, the conductor formation component 110 can form the respective bridge conductor portions 1020, 1022, and 1024 of the central conductor line 1004 to be raised above the other portions of the 1012, 1014, 1016, and 1018 of the substrate 1002 by a desired amount (e.g., 1 μm, 1.5 μm, 2 μm, 2.5 μm, or another desired amount) such that there can be respective gaps of a defined distance (e.g., overall distance) between the respective bridge conductor portions 1020, 1022, and 1024 of the central conductor line 1004 and the respective remaining portions 1006, 1008, and 1010 of the substrate 1002 to facilitate mitigating energy losses in or associated with the substrate 1002. As a non-limiting example, the conductor formation component 110 can form the respective bridge conductor portions 1020, 1022, and 1024 of the central conductor line 1004 to be raised above the other portions of the 1012, 1014, 1016, and 1018 of the substrate 1002 by 2 μm, and the substrate formation component 108 can remove portions of the substrate 1002 to form the remaining portions 1006, 1008, and 1010 of the substrate 1002 having a depth of 2 μm, such that there can be respective gaps of a defined distance of 4 μm between the respective bridge conductor portions 1020, 1022, and 1024 of the central conductor line 1004 and the respective remaining portions 1006, 1008, and 1010 of the substrate 1002.

In accordance with various embodiments, the overall distance between the respective bridge conductor portions 1020, 1022, and 1024 of the central conductor line 1004 and the respective remaining portions 1006, 1008, and 1010 of the substrate 1002 can range from approximately 1 μm to approximately 10 μm. In one example embodiment, the overall distance can be 4 μm. The disclosed subject matter, by employing the hybrid approach, can have an advantage of desirably and significantly mitigating (e.g., reducing or minimizing) energy losses in or associated with the substrate 1002, as compared to conventional techniques for forming CPWs. Also, in some embodiments, in accordance with the disclosed subject matter, the conductor formation component 110 can form the CPW to have a desired amount of impedance, such as, for example, 50 ohms.

The systems and/or devices have been (or will be) described herein with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 11:
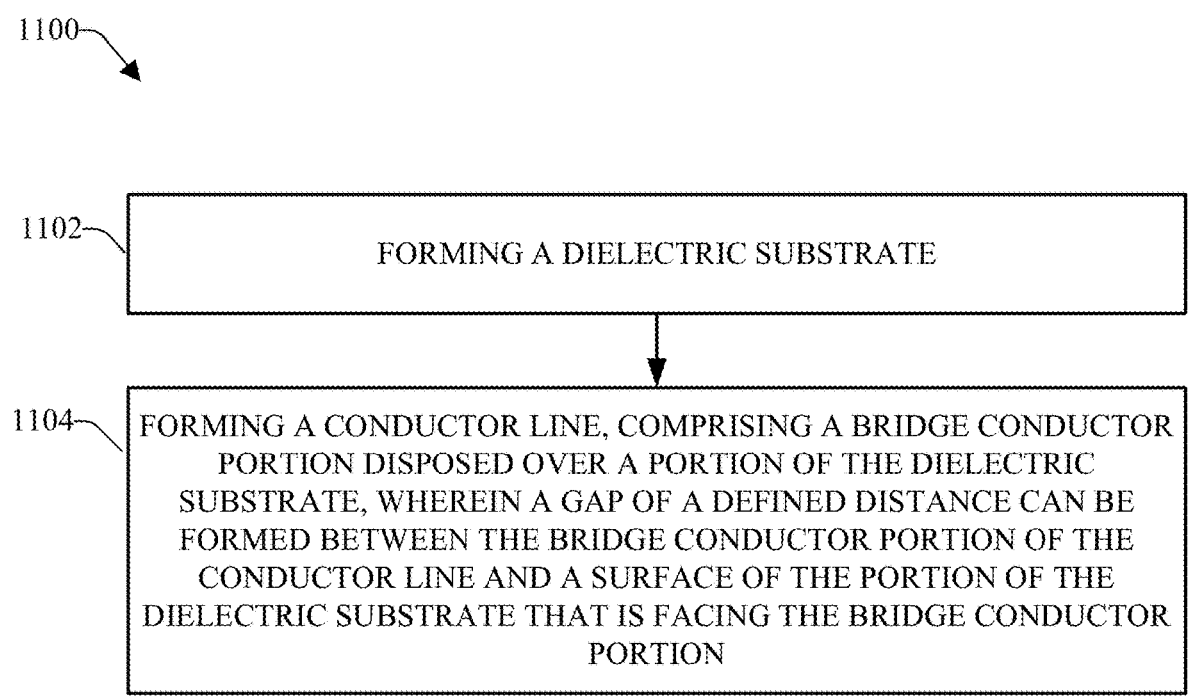
FIG. 11 illustrates a flow diagram of an example, non-limiting method that can be utilized to desirably design circuitry (e.g., a quantum computing circuit) comprising a CPW that can be enhanced to mitigate energy losses, in accordance with various aspects and embodiments of the disclosed subject matter.

FIG. 11 illustrates a flow diagram of an example, non-limiting method 1100 that can be utilized to desirably design circuitry (e.g., a quantum computing circuit) comprising a CPW that can be enhanced to mitigate energy losses, in accordance with various aspects and embodiments of the disclosed subject matter. In some embodiments, the method 1100 can be performed by, for example, a conductor formation component, a substrate formation component, and/or a processor component. Repetitive description of like elements employed in other embodiments described herein is or may be omitted for sake of brevity.

At 1102, a dielectric substrate can be formed. The substrate formation component can form the dielectric substrate, which can have a defined size and a defined shape. In some embodiments, the substrate formation component can form the dielectric substrate on a ground plane layer. The ground plane layer can be or can comprise a desired conductive material. The dielectric substrate can be formed of a dielectric material that can have a desirably high thermal conductivity below 1 K, such as more fully described herein. The dielectric substrate and/or ground plane layer can be part of a quantum computing circuit or quantum computing device.

At 1104, a conductor line, comprising a bridge conductor portion disposed over a portion of the dielectric substrate, can be formed, wherein a gap of a defined distance can be formed between the bridge conductor portion of the conductor line and a surface of the portion of the dielectric substrate that is facing the bridge conductor portion. The conductor formation component can form the conductor line (e.g., central conductor line) to comprise the bridge conductor portion, which can be disposed over the portion of the substrate, wherein there can be a gap of a defined distance formed between the bridge conductor portion of the conductor line and the surface of the portion of the dielectric substrate that is facing the bridge conductor portion. The conductor line can be the central conductor line of the CPW, which can be part of the quantum computing circuit or quantum computing device. The conductor formation component also can form two return conductor lines on the dielectric substrate, wherein there can be one return conductor line on each side of the central conductor line, and wherein the return conductor lines can be separated from the central conductor line by a space of a defined size. In some embodiments, when the ground plane layer is employed, the ground plane layer can be a third return conductor of the CPW.

In some embodiments, to create the gap of the defined distance between the bridge conductor portion and the dielectric substrate, the conductor formation component can form the conductor line to comprise bridge conductor portions, comprising the bridge conductor portion, of a defined length that can be raised by the defined distance (e.g., 4 μm, or other desired distance in the range of approximately 1 μm to 10 μm) over the dielectric substrate, wherein base conductor portions of the conductor line can be situated between and/or adjacent to the bridge conductor portions and can be in contact with the surface of the dielectric substrate.

In other embodiments, to create the gap of the defined distance between the bridge conductor portion and the dielectric substrate, the substrate formation component can remove (e.g., etch away or otherwise remove) portions of the dielectric substrate underneath the bridge conductor portions of the conductor line (e.g., central conductor line) such that the bridge conductor portions of the conductor line can be the defined distance above the surface of the remaining dielectric substrate (e.g., the dielectric substrate remaining after removal of the portions of the dielectric substrate), and the base conductor portions of the conductor line can be in contact with the other portions of the surface of the dielectric substrate that were not removed and are situated between and/or adjacent to the spaces formed by removal of the portions of the dielectric substrate.

In still other embodiments, the disclosed subject matter can employ a hybrid approach that can combine the raising of the bridge conductor portions above the other portions of the dielectric substrate associated with the base conductor portions of the conductor line and also removing portions of the dielectric substrate underneath the bridge conductor portions of the conductor line to achieve the desired gap of the defined distance between the bridge conductor portion and the dielectric substrate.

Figure 12:
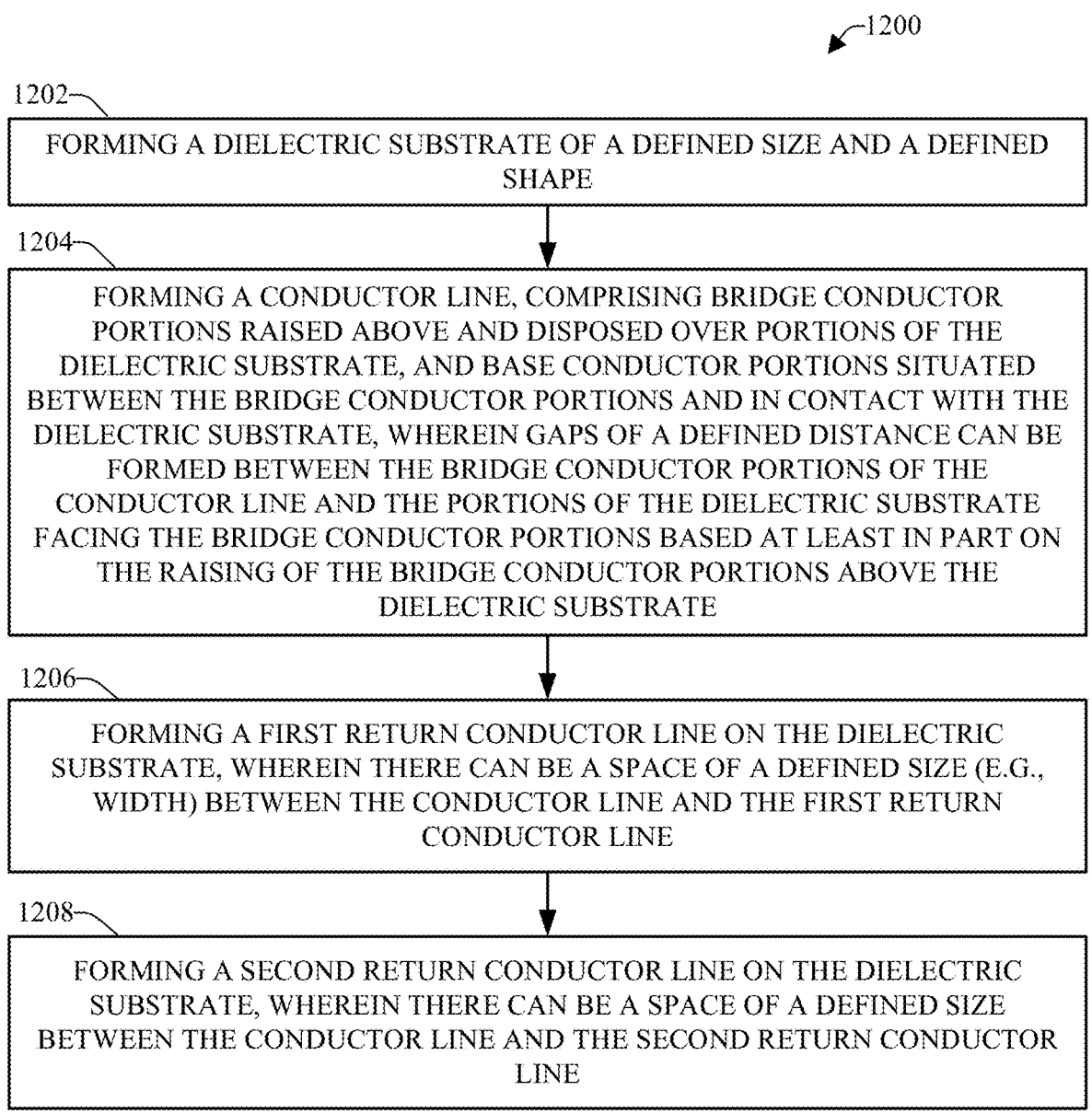
FIG. 12 depicts a flow diagram of another example, non-limiting method for forming a CPW that can be enhanced to include bridge conductor portions of a conductor line that can be raised above a substrate to mitigate energy losses, in accordance with various aspects and embodiments of the disclosed subject matter.

FIG. 12 depicts a flow diagram of another example, non-limiting method 1200 for forming a CPW that can be enhanced to include bridge conductor portions of a conductor line that can be raised above a substrate to mitigate energy losses, in accordance with various aspects and embodiments of the disclosed subject matter. The method 1200 can be performed by, for example, a conductor formation component, a substrate formation component, and/or a processor component. Repetitive description of like elements employed in other embodiments described herein is or may be omitted for sake of brevity.

At 1202, a dielectric substrate of a defined size and a defined shape can be formed. The substrate formation component can form the dielectric substrate having the defined size and defined shape. In some embodiments, the substrate formation component can form the dielectric substrate on a ground plane layer, which can be or can comprise a desired conductive material. The dielectric substrate can be formed of a dielectric material that can have a desirably high thermal conductivity below 1 K, such as more fully described herein. The dielectric substrate and/or ground plane layer can be part of a quantum computing circuit or quantum computing device.

At 1204, a conductor line, comprising bridge conductor portions raised above and disposed over portions of the dielectric substrate, and base conductor portions situated between the bridge conductor portions and in contact with the dielectric substrate, can be formed, wherein gaps of a defined distance can be formed between the bridge conductor portions of the conductor line and the portions of the dielectric substrate facing the bridge conductor portions based at least in part on the raising of the bridge conductor portions above the dielectric substrate. The conductor line can be a central conductor line of the CPW, which can be part of the quantum computing circuit or quantum computing device. The conductor formation component can form the conductor line to comprise bridge conductor portions (e.g., a sequence of bridge conductor portions) that can be raised above and disposed over corresponding portions of the dielectric substrate. The conductor formation component can raise the bridge conductor portions by a defined distance above the surface of the dielectric substrate to form the gaps of the defined distance (e.g., 4 µm, or other desired distance in the range of approximately 1 µm to 10 µm) between the bridge conductor portions and the portions of the dielectric substrate.

At 1206, a first return conductor line can be formed on the dielectric substrate, wherein there can be a space of a defined size (e.g., width) between the conductor line and the first return conductor line. At 1208, a second return conductor line can be formed on the dielectric substrate, wherein there can be a space of a defined size between the conductor line and the second return conductor line. The conductor formation component can form the first return conductor line and the second return conductor line on opposite sides of the conductor line (e.g., central conductor line) of the CPW, wherein the conductor line can be situated between the first return conductor line and the second return conductor line. The conductor formation component can form the first return conductor line and the second return conductor line in relation to the conductor line such that there can be a space of the defined size between the conductor line and the first return conductor line, and there can be a space of the defined size between the conductor line and the second return conductor line.

Figure 13:
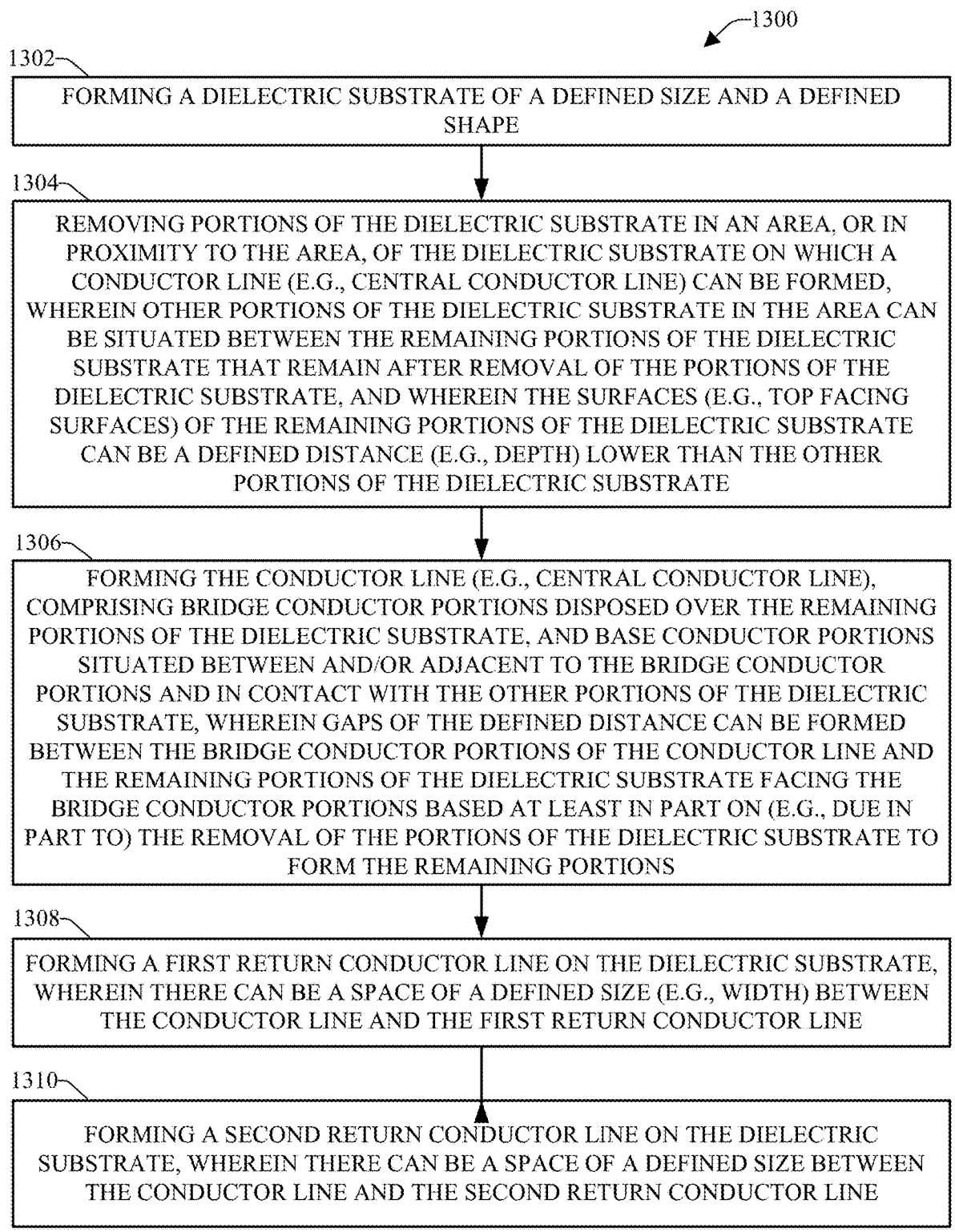
FIG. 13 presents a flow diagram of an example, non-limiting method for forming a CPW that can be enhanced to include bridge conductor portions of a central conductor line that can be disposed over remaining portions of a substrate that can remain after removal of portions of the substrate, in order to mitigate energy losses in or associated with the substrate, in accordance with various aspects and embodiments of the disclosed subject matter.

FIG. 13 presents a flow diagram of an example, non-limiting method 1300 for forming a CPW that can be enhanced to include bridge conductor portions of a central conductor line that can be disposed over remaining portions of a substrate that can remain after removal of portions of the substrate, in order to mitigate energy losses in or associated with the substrate, in accordance with various aspects and embodiments of the disclosed subject matter. The method 1300 can be performed by, for example, a conductor formation component, a substrate formation component, and/or a processor component. Repetitive description of like elements employed in other embodiments described herein is or may be omitted for sake of brevity.

At 1302, a dielectric substrate of a defined size and a defined shape can be formed. The substrate formation component can form the dielectric substrate having the defined size and defined shape. In some embodiments, the substrate formation component can form the dielectric substrate on a ground plane layer, which can be or can comprise a desired conductive material. The dielectric substrate can be formed of a dielectric material that can have a desirably high thermal conductivity below 1 K, such as more fully described herein. The dielectric substrate and/or ground plane layer can be part of a quantum computing circuit or quantum computing device.

At 1304, portions of the dielectric substrate can be removed in an area, or in proximity to the area, of the dielectric substrate on which a conductor line (e.g., central conductor line) can be formed, wherein other portions of the dielectric substrate in the area can be situated between and/or adjacent to the remaining portions of the dielectric substrate that remain after removal of the portions of the dielectric substrate, and wherein the surfaces (e.g., top facing surfaces) of the remaining portions of the dielectric substrate can be a defined distance (e.g., depth) lower than the other portions of the dielectric substrate. The substrate formation component can remove (e.g., etch away) the portions of the dielectric substrate in the area, or in proximity to the area (e.g., at least partially surrounding the area) on which the conductor line can be formed on the dielectric substrate such that there can be the remaining portions of the dielectric substrate which can remain after the removal of the portions of the dielectric substrate, and such that there can be the other portions of the dielectric substrate that can be situated between and/or adjacent to the remaining portions of the dielectric substrate (e.g., at least some of the other portions of the dielectric substrate can be situated in between the remaining portions of the dielectric substrate). The surfaces of the remaining portions of the dielectric substrate can be a defined distance (e.g., 4 µm, or other desired distance in the range of approximately 1 µm to 10 µm) lower in height than the surfaces (e.g., top facing surfaces) of the other portions of the dielectric substrate. The other dimensions (e.g., width and length) of the portions of the dielectric substrate that are removed (and correspondingly the dimensions of the remaining portions of the dielectric substrate) can be as desired, in accordance with the defined circuit design criteria.

At 1306, the conductor line (e.g., central conductor line), comprising bridge conductor portions disposed over the remaining portions of the dielectric substrate, and base conductor portions situated between and/or adjacent to the bridge conductor portions and in contact with the other portions of the dielectric substrate, can be formed, wherein gaps of the defined distance can be formed between the bridge conductor portions of the conductor line and the remaining portions of the dielectric substrate facing the bridge conductor portions based at least in part on (e.g., due in part to) the removal of the portions of the dielectric substrate to form the remaining portions. The conductor line can be a central conductor line of the CPW, which can be part of the quantum computing circuit or quantum computing device. The conductor formation component can form the conductor line to comprise bridge conductor portions (e.g., a sequence of bridge conductor portions) that can be disposed over (e.g., suspended above or over) corresponding remaining portions of the dielectric substrate. The conductor formation component can form the base conductor portions of the conductor line to have the base conductor portions be in contact with the other portions of the dielectric substrate that can be situated in between and/or adjacent to the remaining portions of the dielectric substrate (at least some of the other portions of the dielectric substrate can be situated in between the remaining portions of the dielectric substrate). As the remaining portions of the dielectric substrate can be the defined distance below the other portions of the dielectric substrate on which the base conductor portions of the conductor line are disposed, there can be gaps of the defined distance between the bridge conductor portions of the conductor line and the remaining portions of the dielectric substrate.

At 1308, a first return conductor line can be formed on the dielectric substrate, wherein there can be a space of a defined size (e.g., width) between the conductor line and the first return conductor line. At 1310, a second return conductor line can be formed on the dielectric substrate, wherein there can be a space of a defined size between the conductor line and the second return conductor line. The conductor formation component can form the first return conductor line and the second return conductor line on opposite sides of the conductor line (e.g., central conductor line) of the CPW, wherein the conductor line can be situated between the first return conductor line and the second return conductor line. The conductor formation component can form the first return conductor line and the second return conductor line in relation to the conductor line such that there can be a space of the defined size between the conductor line and the first return conductor line, and there can be a space of the defined size between the conductor line and the second return conductor line.

For simplicity of explanation, the methods and/or computer-implemented methods are depicted and described as a series of acts. It is to be understood and appreciated that the disclosed subject matter is not limited by the acts illustrated and/or by the order of acts, for example acts can occur in various orders and/or concurrently, and with other acts not presented and described herein. Furthermore, not all illustrated acts can be required to implement the computer-implemented methods in accordance with the disclosed subject matter. In addition, those skilled in the art will understand and appreciate that the computer-implemented methods could alternatively be represented as a series of interrelated states via a state diagram or events. Additionally, it should be further appreciated that the computer-implemented methods disclosed hereinafter and throughout this specification are capable of being stored on an article of manufacture to facilitate transporting and transferring such computer-implemented methods to computers. The term article of manufacture, as used herein, is intended to encompass a computer program accessible from any computer-readable device or storage media.

Figure 14:
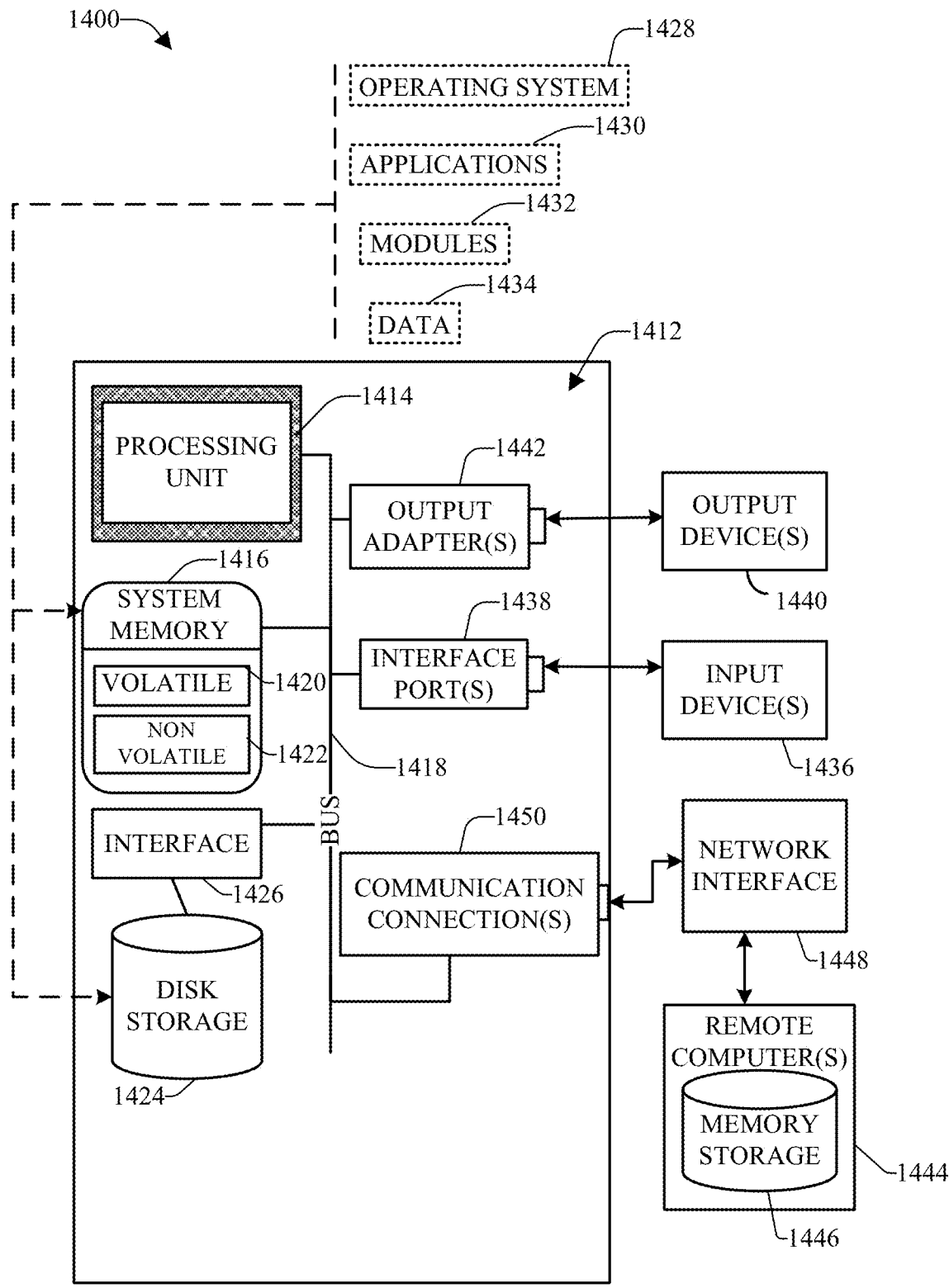
FIG. 14 illustrates a block diagram of an example, non-limiting operating environment in which one or more embodiments described herein can be facilitated.

In order to provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. Repetitive description of like elements employed in other embodiments described herein is or may be omitted for sake of brevity. With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1416 can also include volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1420 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1412 also can include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412. System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a method of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

One or more embodiments can be a system, a method, an apparatus and/or a computer program product at any possible technical detail level of integration. The computer program product can include a computer readable storage medium (or media) having computer readable program instructions thereon for causing a processor to carry out aspects of the one or more embodiments. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the disclosed subject matter can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the disclosed subject matter.

Aspects of disclosed subject matter are described herein with reference to flowchart illustrations and/or block diagrams of methods, apparatus (systems), and computer program products according to embodiments of the subject disclosure. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the disclosed subject matter. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can be implemented in combination with other program modules. Generally, program modules include routines, programs, components, data structures, etc. that perform particular tasks and/or implement particular abstract data types. Moreover, those skilled in the art will appreciate that the computer-implemented methods disclosed herein can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," "data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM)). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum device, comprising:
   a substrate; and
   a coplanar waveguide, comprising:
      a first return conductor line,
      a second return conductor line, and
      a central conductor line located between and separated from the first return line conductor line and the second return conductor line, wherein the central conductor line comprises one or more base conductor portions disposed directly on the substrate, and a bridge portion disposed over a portion of the substrate, wherein a gap of a defined distance is formed between the bridge portion of the central conductor line and a surface of the portion of the substrate that is facing the bridge portion.

2. The device of claim 1, wherein the bridge portion is a first bridge portion, and wherein the central conductor line comprises a set of bridge portions, including the first bridge portion and a second bridge portion, and wherein a base conductor portion of the one or more base conductor portions is disposed directly on the substrate and situated between the first bridge portion and the second bridge portion.

3. The device of claim 2, wherein the first bridge portion and the second bridge portion are raised above the one or more base conductor portions and the surface of the substrate to form gaps, comprising the gap, between the substrate and the first bridge portion and the second bridge portion.

4. The device of claim 1, wherein a conductive layer is disposed on the substrate, wherein the conductive layer comprises a first portion of the conductive layer, a second portion of the conductive layer, and the central conductor line situated between the first portion of the conductive layer and the second portion of the conductive layer with a first space formed between the central conductor line and the first portion of the conductive layer and a second space formed between the central conductor line and the second portion of the conductive layer.

5. The device of claim 1, wherein the defined distance formed between the bridge portion of the central conductor line and the surface of the portion of the substrate reduces energy loss associated with the substrate without exceeding a defined threshold amount of distance, in accordance with a defined circuit design criterion.

6. The device of claim 1, wherein the central conductor line is formed of a superconducting material.

7. The device of claim 1, wherein the substrate comprises a dielectric material and has a thermal conductivity level that is equal to or greater than a defined threshold conductivity level.

8. The device of claim 1, wherein the substrate and the coplanar waveguide are part of a quantum computing circuit that comprises a qubit.

9. A method, comprising:
   forming a substrate of a quantum device; and
   forming a coplanar waveguide, comprising:
      a first return conductor line,
      a second return conductor line, and
      a central conductor line located between and separated from the first return line conductor line and the second return conductor line, wherein the central conductor line comprises one or more base conductor portions disposed directly on the substrate, and a bridge conductor portion disposed over a portion of the substrate, wherein a gap of a defined distance is formed between the bridge conductor portion of the conductor line and a surface of the portion of the substrate that is facing the bridge conductor portion.

10. The method of claim 9, wherein the bridge conductor portion is a first bridge conductor portion, and wherein the forming the conductor line comprises forming the conductor line comprising a set of bridge conductor portions, including the first bridge conductor portion and a second bridge conductor portion, and further comprising a base conductor portion of the one or more base conductor portions disposed directly on the substrate and situated between the first bridge conductor portion and the second bridge conductor portion.

11. The method of claim 10, wherein the first bridge conductor portion and the second bridge conductor portion are formed at an elevated level relative to the one or more base conductor portions and the surface of the substrate to form gaps, comprising the gap, between the substrate and the first bridge conductor portion and the second bridge conductor portion.

12. The method of claim 9, wherein a conductive layer is disposed on the substrate, and wherein the conductive layer comprises a first portion of the conductive layer, a second portion of the conductive layer, and the conductor line situated between the first portion of the conductive layer and the second portion of the conductive layer, with a first space formed between the conductor line and the first portion of the conductive layer and a second space formed between the conductor line and the second portion of the conductive layer.

13. The method of claim 9, wherein the conductor line is formed of a superconducting material, and wherein the substrate comprises a dielectric material and has a thermal conductivity level that is equal to or greater than a defined minimum threshold conductivity level.

14. The method of claim 9, wherein the substrate and the coplanar waveguide are part of a quantum computing circuit that comprises a qubit.

15. A computer program product that facilitates creating a quantum computing circuit, the computer program product comprising a computer readable storage medium having program instructions embodied therewith, the program instructions are executable by a processor to cause the processor to:
form a dielectric substrate comprising a dielectric material to enable creation of circuit components of the quantum computing circuit; and
form a coplanar waveguide, comprising:
a first return conductor line,
a second return conductor line, and
a central conductor line located between and separated from the first return line conductor line and the second return conductor line, wherein the central conductor line comprises one or more base conductor portions disposed directly on the dielectric substrate, and a bridge portion disposed over a portion of the dielectric substrate, wherein a gap of a defined distance is formed between the bridge portion of the central conductor line and a surface of the portion of the dielectric substrate that is facing the bridge portion, and wherein the conductor line comprises a superconductor material.

16. The computer program product of claim 15, wherein the bridge portion is a first bridge portion, and wherein the central conductor line comprises a set of bridge portions, including the first bridge portion and a second bridge portion, and wherein a base conductor portion of the one or more base conductor portions is disposed directly on the substrate and situated between the first bridge portion and the second bridge portion.

17. The computer program product of claim 16, wherein the first bridge portion and the second bridge portion are raised above the one or more base conductor portions and the surface of the substrate to form gaps, comprising the gap, between the substrate and the first bridge portion and the second bridge portion.

18. The computer program product of claim 15, wherein a conductive layer is disposed on the substrate, wherein the conductive layer comprises a first portion of the conductive layer, a second portion of the conductive layer, and the central conductor line situated between the first portion of the conductive layer and the second portion of the conductive layer with a first space formed between the central conductor line and the first portion of the conductive layer and a second space formed between the central conductor line and the second portion of the conductive layer.

19. The computer program product of claim 15, wherein the defined distance formed between the bridge portion of the central conductor line and the surface of the portion of the substrate reduces energy loss associated with the substrate without exceeding a defined threshold amount of distance, in accordance with a defined circuit design criterion.

20. The computer program product of claim 15, wherein the central conductor line is formed of a superconducting material.

21. The computer program product of claim 15, wherein the substrate comprises a dielectric material and has a thermal conductivity level that is equal to or greater than a defined threshold conductivity level.

22. The computer program product of claim 15, wherein the quantum computing circuit comprises a qubit.

23. A system, comprising:
a memory that stores computer-executable components; and
a processor, operatively coupled to the memory, that executes the computer-executable components, the computer-executable components comprising:
a substrate formation component that forms a dielectric substrate as part of a quantum computing circuit; and
a conductor formation component that forms a coplanar waveguide, comprising:
a first return conductor line,
a second return conductor line, and
a central conductor line located between and separated from the first return line conductor line and the second return conductor line, wherein the central conductor line comprises one or more base conductor portions disposed directly on the dielectric substrate, and a bridge conductor portion positioned over a portion of the dielectric substrate, wherein a space of a defined distance is formed between the bridge conductor portion of the central conductor line and a surface of the portion of the dielectric substrate that is facing the bridge conductor portion.

24. The system of claim 23, wherein the bridge conductor portion is a first bridge conductor portion, and wherein the conductor formation component forms the conductor line component to comprise a set of bridge conductor portions, including the first bridge conductor portion and a second bridge conductor portion, and a base conductor portion of the one or more base conductor portions,
wherein the base conductor portion is disposed directly on the dielectric substrate and positioned between the first bridge conductor portion and the second bridge conductor portion, and
wherein the first bridge conductor portion and the second bridge conductor portion are at an elevated level as compared to the base conductor portion and the surface of the dielectric substrate to form spaces, comprising the space, between the dielectric substrate and the first bridge conductor portion and the second bridge conductor portion.

25. A computer program product that facilitates forming a quantum computing circuit, the computer program product comprising a computer readable storage medium having program instructions embodied therewith, the program instructions are executable by a processor to cause the processor to:
form a substrate comprising a dielectric material to enable creation of circuit components of the quantum computing circuit; and
form a coplanar waveguide, comprising:
a first return conductor line,
a second return conductor line, and
a central conductor line located between and separated from the first return line conductor line and the second return conductor line, wherein the central conductor line comprises one or more base conductor portions disposed directly on the substrate, and a bridge conductor portion positioned over a portion of the substrate, wherein a space of a defined distance is formed between the bridge conductor portion of the conductor line and a surface of the portion of the substrate that is facing the bridge conductor portion.

\* \* \* \* \*